US007230830B2

(12) United States Patent
Ujike et al.

(10) Patent No.: US 7,230,830 B2
(45) Date of Patent: Jun. 12, 2007

(54) SEMICONDUCTOR DEVICE SOCKET

(75) Inventors: Ryo Ujike, Tokyo (JP); Takahiro Oikawa, Tokyo (JP); Katsumi Suzuki, Tokyo (JP); Eiji Kobori, Tokyo (JP); Eisaku Tsubota, Kawasaki (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 11/106,461

(22) Filed: Apr. 15, 2005

(65) Prior Publication Data

US 2005/0231919 A1    Oct. 20, 2005

(30) Foreign Application Priority Data

Apr. 16, 2004 (JP) ............................. 2004-121806
Mar. 16, 2005 (JP) ............................. 2005-075974

(51) Int. Cl.
*H05K 7/20* (2006.01)
*H01R 12/00* (2006.01)
*H01R 13/62* (2006.01)
*H01L 23/34* (2006.01)

(52) U.S. Cl. .................. 361/704; 439/73; 439/331; 439/330; 439/259; 439/226; 439/487; 439/266; 257/718; 257/719; 324/760; 324/765

(58) Field of Classification Search ................ 257/718, 257/719; 439/73, 226, 330, 266, 487, 331; 324/760, 765; 361/704
See application file for complete search history.

(56) References Cited

U.S. PATENT DOCUMENTS 4,715,823 A   12/1987   Ezura et al.
4,887,969 A   12/1989   Abe
5,249,972 A   10/1993   Walker
5,301,416 A    4/1994   Foerstel
5,458,499 A   10/1995   Matsuoka
5,482,471 A    1/1996   Mori et al.
5,493,237 A    2/1996   Volz et al.
5,518,410 A    5/1996   Masami
5,531,608 A    7/1996   Abe (Continued)

FOREIGN PATENT DOCUMENTS

EP    0 969 710 A2    1/2000

(Continued)

OTHER PUBLICATIONS

Co-Pending U.S. Appl. No. 11/212,706; Title: Method of Mounting and Demounting a Semiconductor Device, Device for Mounting and Demounting a Semiconductor Device Using the Same, and Socket for Semiconductor Device; U.S. Filing Date: Aug. 29, 2005.

(Continued)

*Primary Examiner*—Lisa Lea-Edmonds
*Assistant Examiner*—Zachary Pape
(74) *Attorney, Agent, or Firm*—Finnegan Henderson Farabow Garrett & Dunner, LLP

(57) ABSTRACT

In a state wherein front ends of latch members 18A and 18B are apart from each other so that the upper surface of an alignment plate/positioning member 24 is outside, a pressing section 12PU of a heat sink member 12 is brought into contact with the periphery of a semiconductor device 22.

13 Claims, 20 Drawing Sheets

U.S. PATENT DOCUMENTS

| | | |
|---|---|---|
| 5,573,427 A | 11/1996 | Sagano |
| 5,807,104 A | 9/1998 | Ikeya et al. |
| 5,865,639 A * | 2/1999 | Fuchigami et al. ......... 439/330 |
| 5,923,179 A | 7/1999 | Taylor |
| 6,106,319 A | 8/2000 | Fukunaga et al. |
| 6,149,449 A | 11/2000 | Abe |
| 6,155,859 A | 12/2000 | Choy |
| 6,213,806 B1 | 4/2001 | Choy |
| 6,243,267 B1 | 6/2001 | Chuang |
| 6,280,219 B1 | 8/2001 | Sano et al. |
| 6,280,222 B1 | 8/2001 | Walkup |
| 6,283,780 B1 * | 9/2001 | Yamamoto et al. ......... 439/266 |
| 6,296,505 B1 | 10/2001 | Fukunaga et al. |
| 6,322,384 B1 | 11/2001 | Ikeya |
| 6,350,138 B1 | 2/2002 | Atobe et al. |
| 6,383,002 B1 | 5/2002 | Ohashi |
| 6,439,897 B1 | 8/2002 | Ikeya |
| 6,443,741 B1 | 9/2002 | Watanabe |
| 6,517,370 B2 | 2/2003 | Fukunaga |
| 6,739,894 B2 * | 5/2004 | Ogura ........................ 439/330 |
| 6,752,645 B2 | 6/2004 | Nakamura et al. |
| 6,758,684 B2 | 7/2004 | Oikawa et al. |
| 6,776,641 B2 | 8/2004 | Hachuda |
| 6,872,083 B2 | 3/2005 | Kanesashi |
| 6,945,792 B2 * | 9/2005 | Hayakawa ................... 439/73 |
| 2002/0160641 A1 * | 10/2002 | Okamoto .................... 439/266 |
| 2004/0248435 A1 | 12/2004 | Sato et al. |

FOREIGN PATENT DOCUMENTS

| | | |
|---|---|---|
| EP | 0 969 711 A2 | 1/2000 |
| EP | 1 111 724 A2 | 6/2001 |
| JP | 60-189977 | 12/1985 |
| JP | 62-160676 | 7/1987 |
| JP | 63-299257 | 12/1988 |
| JP | 05-029050 | 2/1993 |
| JP | 05-047445 | 2/1993 |
| JP | 05-020286 | 3/1993 |
| JP | 06-020752 A | 1/1994 |
| JP | 06-020753 A | 1/1994 |
| JP | 06-203936 A | 7/1994 |
| JP | 06-290839 A | 10/1994 |
| JP | 07-239362 | 9/1995 |
| JP | 8-046335 | 2/1996 |
| JP | 08-138812 | 5/1996 |
| JP | 2665419 B2 | 6/1997 |
| JP | 09-199217 | 7/1997 |
| JP | 09-199250 A | 7/1997 |
| JP | 09-211067 | 8/1997 |
| JP | 09-245920 A | 9/1997 |
| JP | 10-073635 | 3/1998 |
| JP | 10-256764 | 9/1998 |
| JP | 10-302925 | 11/1998 |
| JP | 11-097818 | 4/1999 |
| JP | 11-126671 A | 5/1999 |
| JP | 11-238566 A | 8/1999 |
| JP | 2000-113954 A | 4/2000 |
| JP | 2000-150092 A | 5/2000 |
| JP | 2000-182739 A | 6/2000 |
| JP | 2000-340324 A | 12/2000 |
| JP | 2001-066346 A | 3/2001 |
| JP | 2001-185313 | 7/2001 |
| JP | 2001-326045 | 11/2001 |
| JP | 03-257994 | 12/2001 |
| JP | 2002-063975 A | 2/2002 |
| JP | 2002-202729 | 7/2002 |
| JP | 2003-007942 | 1/2003 |
| JP | 2003-123926 | 4/2003 |
| JP | 2004-014873 | 1/2004 |

OTHER PUBLICATIONS

Co-Pending U.S. Appl. No. 11/448,900, Title: Socket for Semiconductor Device, filed Jun. 8, 2006.

Co-Pending U.S. Appl. No. 11/448,899, Title: Socket for Semiconductor Device, filed Jun. 8, 2006.

Co-Pending U.S. Appl. No. 11/448,873, Title: Socket for Semiconductor Device, filed Jun. 8, 2006.

* cited by examiner

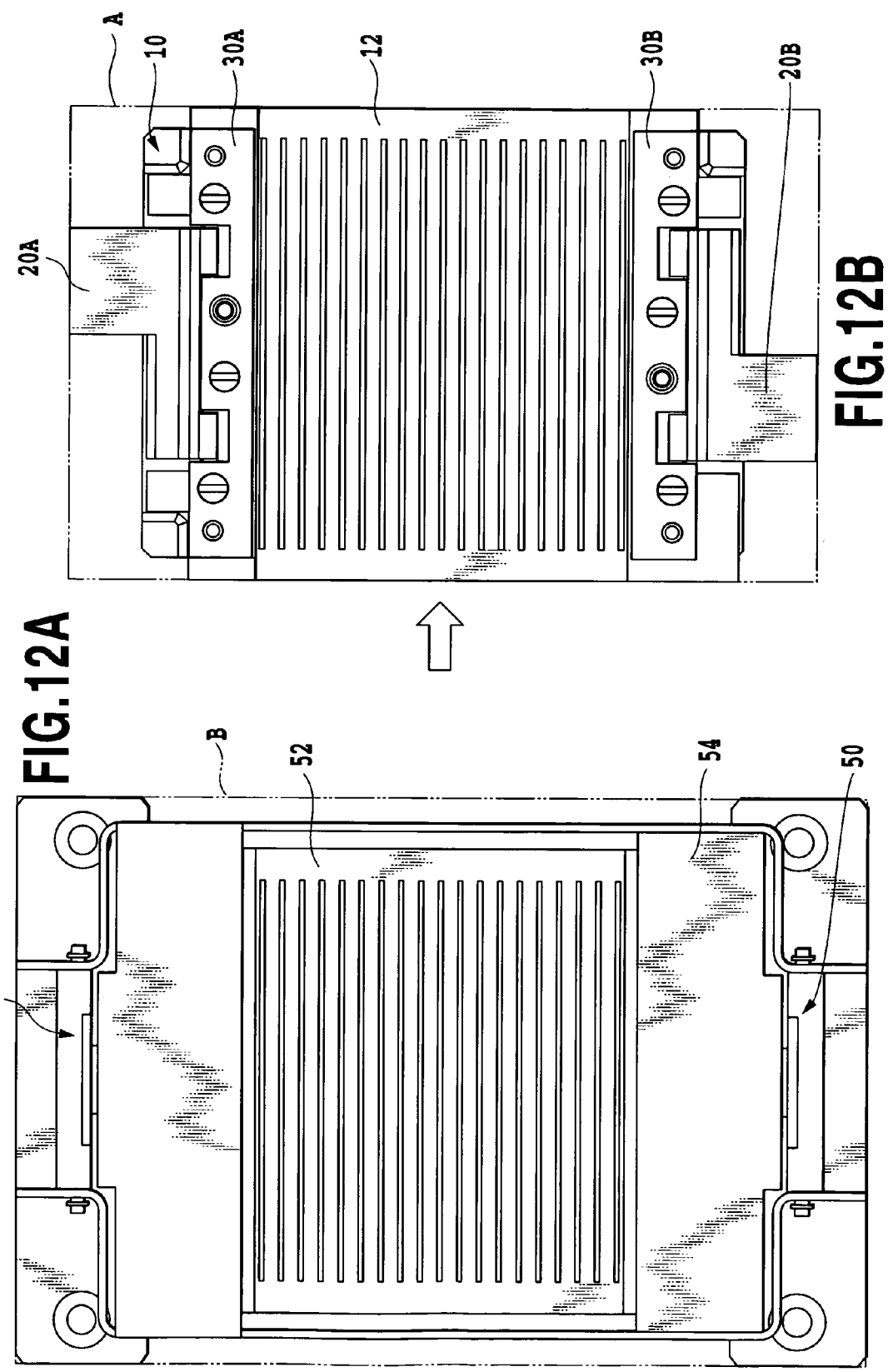

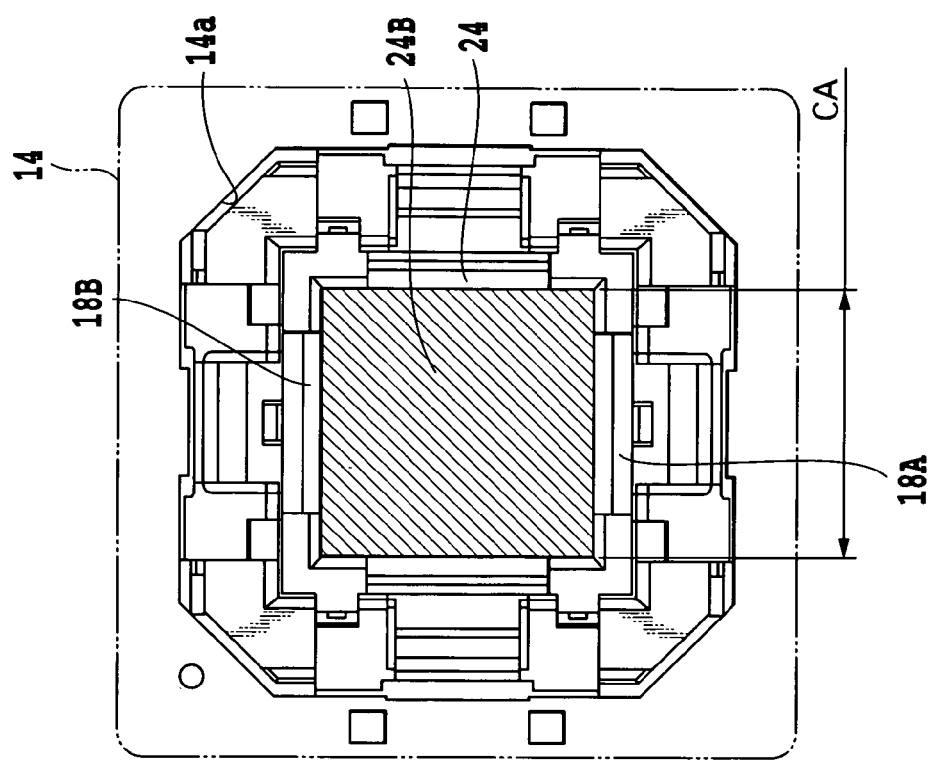
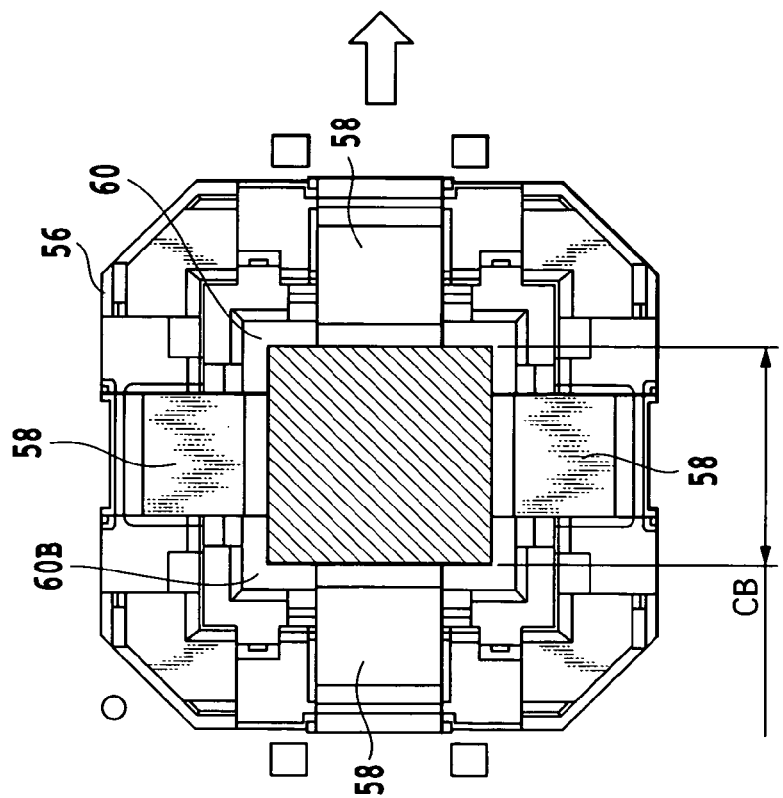
FIG.13B
FIG.13A

SEMICONDUCTOR DEVICE SOCKET

This application claims priority from Japanese Patent Application Nos. 2004-121806 filed Apr. 16, 2004, and 2005-75974 filed Mar. 16, 2005, which are hereby incorporated by reference herein.

BACKGROUND OF THE INVENTION

1. Field of the Invention

The present invention relates to a semiconductor device socket provided with a heat sink.

2. Description of the Related Art

Semiconductor devices to be mounted to electronic equipments or others are subjected to various tests before being actually mounted thereto so that the latent defects thereof are removed. These tests are non-destructively carried out by the application of voltage stress, the operation at a high temperature or the reservation in a hot environment in correspondence to the thermal and mechanical environmental tests. A semiconductor device socket subjected to such tests is generally called as an IC sockets, and a plurality thereof are disposed on a printed wiring board, for example, having an electric conductive layer.

When a semiconductor device consuming a relatively large amount of electric power is tested, a semiconductor device socket provided with a heat sink as a cooling apparatus has been proposed.

Such a semiconductor device socket, for example, of an open-top type has heat sinks in a link mechanism operating in association with the motion of a frame type cover member (an operative member) disposed in an upper portion of a socket body, as disclosed in Japanese Patent Application Laid-open Nos. 2003-123926, 2003-303658 and 2001-110950. When the cover member is located at the uppermost end position, these heat sinks are apart from an periphery of the semiconductor device; on the other hand, when the cover member is located at the lowermost end position, they are in contact with the periphery of the cover member.

Alternatively, a clamshell type semiconductor device socket disclosed, for example, in Japanese Patent Application Laid-open No. Hei 11-251026 is provided via a retaining member with a heat sink on the periphery of a pressing cover supported so as to move rotationally in a socket body. When the pressing cover is held on the socket body together with the heat sink, the heat sink is brought into contact with the periphery of the mounted IC package.

To automate a series of steps in the above-mentioned tests, there is a proposal, for example, in Japanese Patent Application Laid-open No. 2003-7942 wherein a heat sink provided separately from a socket body of a semiconductor device socket is fixed to a heat sink support to be detachably mounted to the socket body. In this semiconductor device socket, a fastening device (an attachment lever) for selectively holding the heat sink support relative to the socket body is provided at the heat sink support to encircle the heat sink around.

SUMMARY OF THE INVENTION

When the semiconductor device socket to which the heat sink is fixed via the heat sink support is disposed in a test device, there is a risk in that a cooling air circulating within the test device to be supplied to fins of the heat sink impinges upon a fixing device thereof, resulting in the reduction of an amount of the cooling air fed to the heat sink.

Further, in view of the recent trend for developing semiconductor devices consuming a relatively large amount of electric power, it is desired to further increase the contact area between the heat sink and the periphery of the semiconductor device as well as a surface area of fins of the heat sink. While, on the standpoint for facilitating the test efficiency by increasing the number of semiconductor device sockets to be fixed onto one printed wiring board disposed in the test device, it is desired to miniaturize the semiconductor device socket.

When the fastening device (the attachment lever) is provided on the heat sink support as described above, there is a limit in the compatibility of the increase in the contact area between the heat sink and the periphery of the semiconductor device with the miniaturization of the semiconductor device socket.

In view of the above-mentioned problems, an object of the present invention is to provide a semiconductor device socket having a heat sink, capable of causing the increase in the contact area between the heat sink and the periphery compatible with the miniaturization of the semiconductor device socket.

To achieve the above object, a semiconductor device socket according to the present invention comprises a socket body provided with a semiconductor device accommodation portion for accommodating a semiconductor device and a group of contact terminals for electrically connecting the semiconductor device accommodated in the semiconductor device accommodation portion with external electronic circuits; a holding device provided around the semiconductor device accommodation portion to be capable of selectively occupying either a position for holding the semiconductor device in the semiconductor device accommodation portion or a position for releasing the semiconductor device therefrom; a holding device driving section for driving the holding device; and a heat sink member detachably disposed in the socket body, having a contacting section brought into contact with an periphery of the semiconductor device disposed in the semiconductor device accommodation portion to cool the semiconductor device, wherein when the heat sink member is attached to the socket body, the contacting section of the heat sink member is brought into contact with the periphery of the semiconductor device while the holding device occupies the released position by the holding device driving section.

As apparent from the above description, according to the inventive semiconductor device socket, since the contacting section of the heat sink is brought into contact with the periphery of the semiconductor device when the heat sink member is attached to the socket body while the holding device occupies the released position by the holding device driving section, the increase in the m contact area of the heat sink with the periphery of the semiconductor device is compatible with the miniaturization of the semiconductor device socket.

The above and other objects, effects, features and advantages of the present invention will become more apparent from the following description of embodiments thereof taken in conjunction with the accompanying drawings.

BRIEF DESCRIPTION OF THE DRAWINGS

FIGS. 12A and 12B are plan views, respectively, made to available for comparing a mounting area of one conventional semiconductor device socket with that of one heat sink in one embodiment of the present invention;

FIGS. 13A and 13B are plan views, respectively, made to available for comparing a contact area of the heat sink member with the semiconductor device package in the conventional semiconductor device socket to that of the heat sink member with the semiconductor device package in one embodiment of the present invention;

DESCRIPTION OF THE PREFERRED EMBODIMENTS

Figure 2:
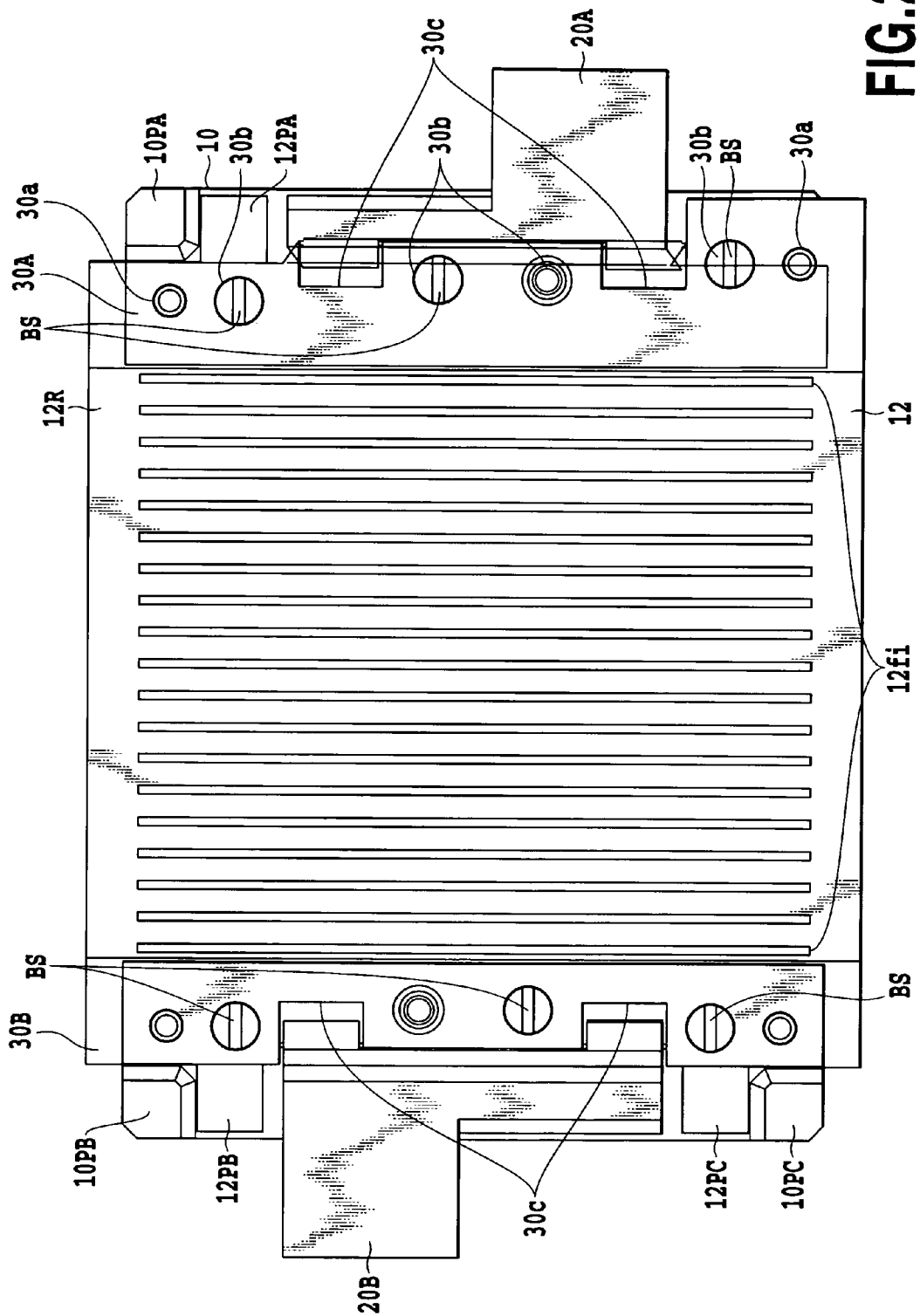
FIG. 2 is a plan view showing an appearance of the embodiment shown in FIG. 1.
Figure 3:
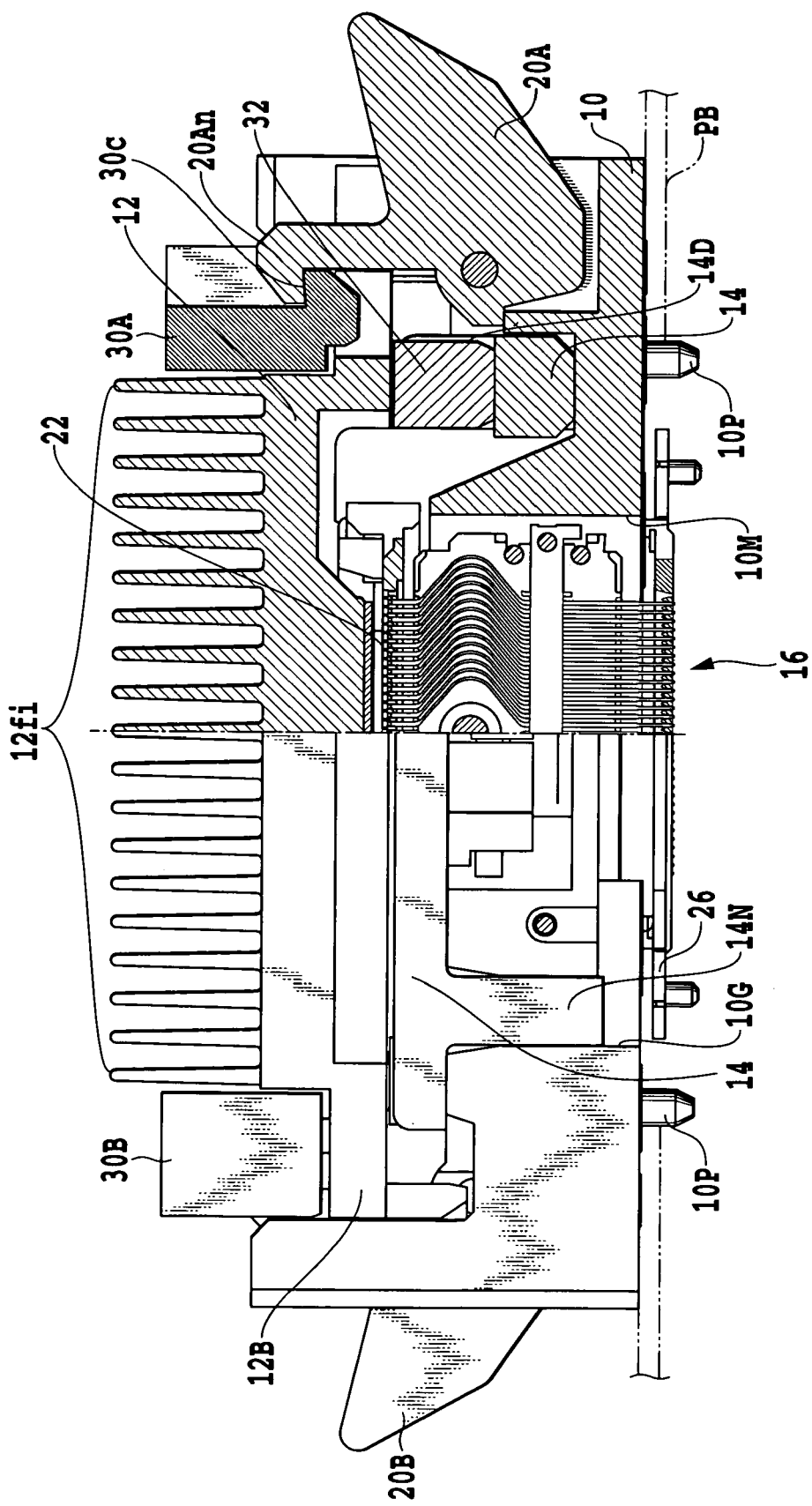
FIG. 3 is a sectional view of the embodiment shown in FIG. 2 as seen from a front side.

FIGS. 2 and 3 illustrate an appearance and a construction, respectively, of one embodiment of the semiconductor device socket according to the present invention together with a printed wiring board.

In FIG. 3, the semiconductor device socket is positioned and disposed on a printed wiring board PB having an input/output section for transmitting predetermined test signals or abnormality signals representing a short-circuit or others from semiconductor devices as objects to be tested. The group of semiconductor device sockets are arranged at predetermined positions on the printed wiring board PB in the vertical and horizontal directions. In this regard, in FIGS. 2 and 3, solely a single semiconductor device socket is shown as a representative.

The semiconductor device socket mainly includes a socket body 10 having an accommodation portion for mounting one semiconductor device in a detachable manner, a contact pin module 16 disposed within the socket body 10, for electrically connecting a group of terminals of the semiconductor device described later to an electrode pad section of the printed wiring board PB, a cover member 14 for causing latch members 18A and 18B (see FIG. 4) in the socket body 10 to carry out the holding or releasing motion, a heat sink member 12 mounted to the socket body 10 in a detachable manner for cooling the semiconductor device mounted to the accommodation portion, and lever members 20A and 20B for selectively holding the heat sink member 12 on the socket body 10.

Figure 4:
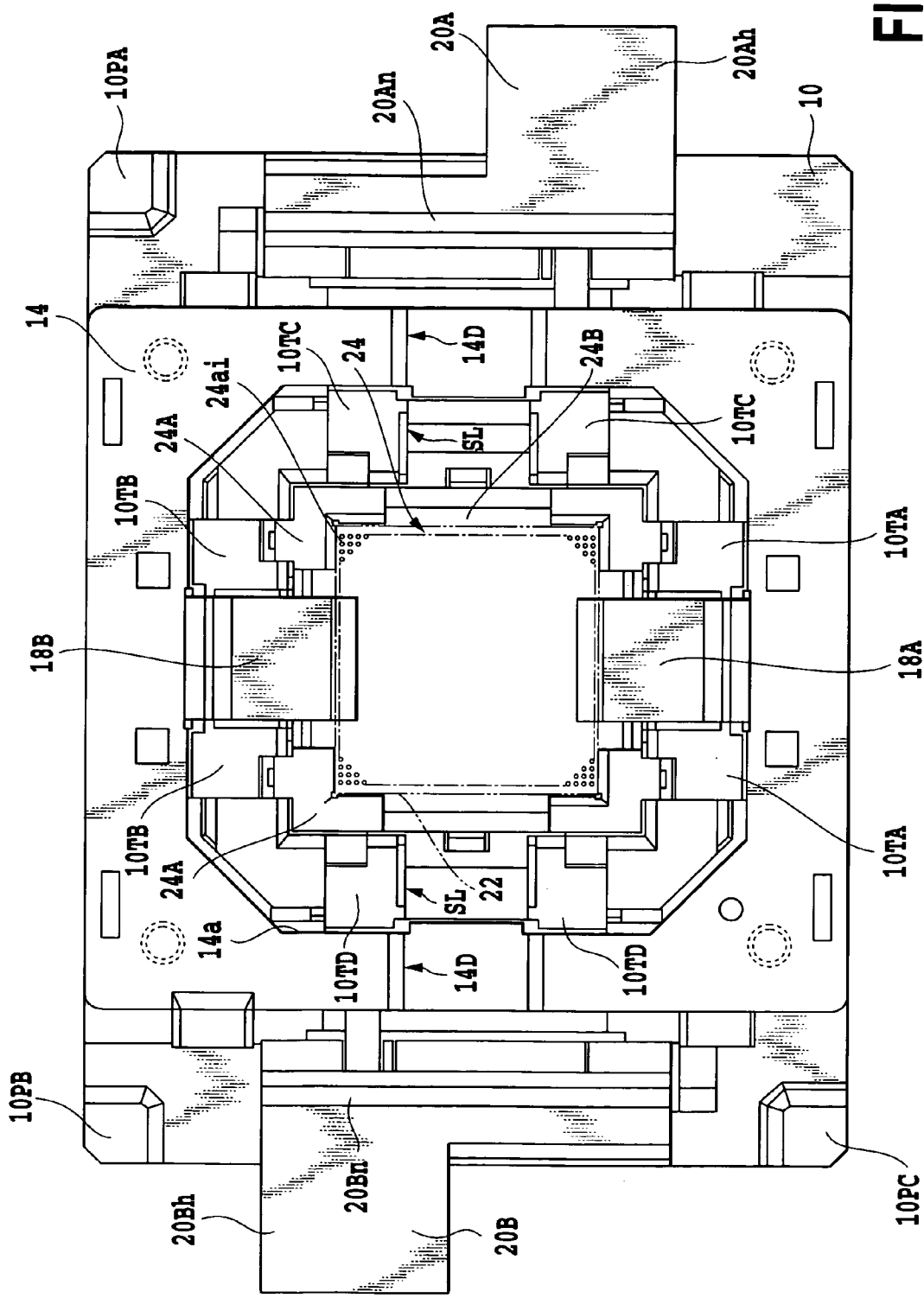
FIG. 4 is a plan view showing a socket body of the embodiment shown in FIG. 2 while removing a heat sink member therefrom.

As shown in FIGS. 3 and 4, the socket body 10 mainly includes a contact pin module 16 for electrically connecting the respective electrode pad sections in the printed wiring board PB to terminals of the contact pin module 16, an alignment plate/positioning member 24 placed on an upper surface of the contact pin module 16 while positioning the respective electrodes of the semiconductor device 22 to the terminal section of the contact pin module 16 as well as accommodating the semiconductor device 22 therein, the cover member 14 disposed above the alignment plate/positioning member 24 to be movable upward and downward while encircling the contact pin module 16, for rotating a pair of latch members 18 described later, and the latch members 18A and 18B for selectively pressing the respective terminals in the semiconductor device 22 to the contact pin module 16 via the alignment plate/positioning member 24 and holding the semiconductor device 22 on the alignment plate/positioning member 24.

The semiconductor device 22 to be tested is, for example, of a BGA type having a generally square shape. In the generally square-shaped semiconductor device 22, a plurality of electrodes are formed at a predetermined interval between them all over a surface opposed to a surface on which the alignment plate/positioning member 24, as terminals to be electrically connected to the contact pin module 16 via the respective through-holes of the alignment plate/positioning member 24.

The socket body 10 is molded with heat durable plastic material such as polyimide resin. On a bottom surface of the socket body 10, there are a plurality of positioning pins 10P. The bottom surface of the socket body 10 is fixed at a predetermined position of the printed wiring board PB by means of screw fasteners not shown.

Also, the bottom surface of the socket body 10 has a recess in which a lower alignment plate/positioning member 26 is fitted and accommodated when the socket body 10 is fixed to the printed wiring board PB.

In a generally central area of the socket body 10, there is a module accommodation portion 10M for accommodating the contact pin module 16.

Figure 9:
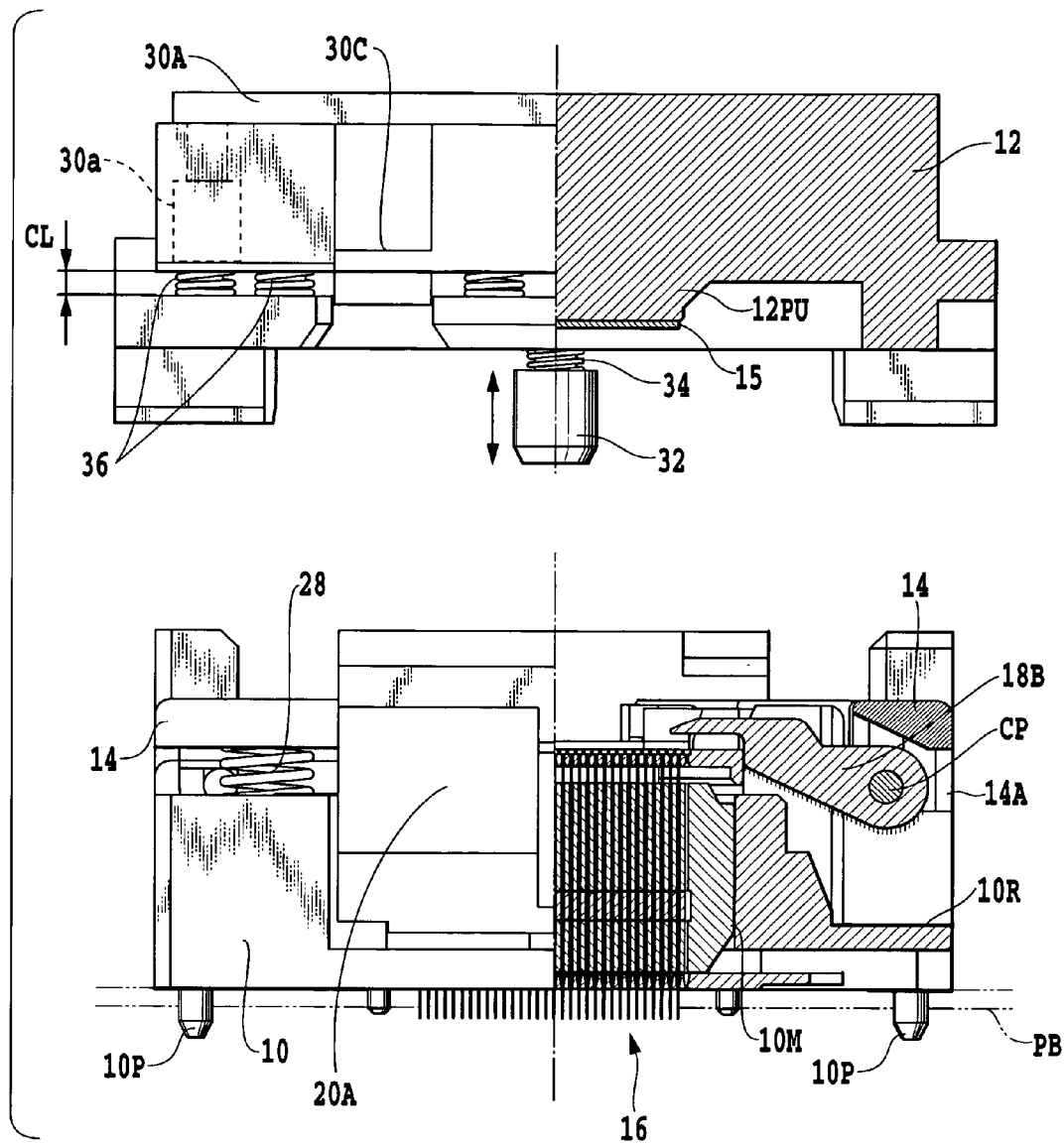
FIG. 9 is an illustration made to available for explaining the attachment of the heat sink member to the socket body in the embodiment shown in FIG. 2.

As shown in FIG. 9, a pair of opposite recesses 10R are provided around the module accommodation portion 10M. A lower end of an arm member 14A formed integral with the cover member 14 and a proximal end of the latch member 18A (18B) are selectively inserted into the respective recess 10M (see FIG. 9) when the cover member 14 is lowered. The proximal end of the latch member 18A (18B) constituting part of a holding device is coupled to the lower end of the arm member 14A by means of a coupling pin CP inserted into a hole at the lower end of the arm member 14A as shown in FIG. 9.

On the outer periphery of the respective recess, guide members 10TA and 10TB are opposed to each other. Since the guide members 10TA and 10TB has the same structure, solely the guide member 10TA will be described below and the explanation of the guide member 10TB will be eliminated.

The guide member 10TA has opposite walls on opposite sides of the latch member 18A. On the inner surface of the respective wall, an elongate groove for guiding a guide pin (not shown) of the latch member 18A extends slantly downward at a predetermined angle. Also, in a portion adjacent to each of opposite ends of the guide member 10TA in the socket body 10, a spring-receiving section (not shown) is formed in which one end of a coil spring 28 is disposed for biasing the cover member 14 in a direction away from the socket body 10.

In this regard, also on an inner surface of the respective wall of the guide member 10TB, an elongate groove for guiding the guide pin of the latch member 18B extends slantly downward at a predetermined angle.

Thereby, when the cover member 14 described later descends, the latch members 18A and 18B are made to rotate so that front ends thereof are away from each other. On the other hand, the front ends of the latch members 18A and 18B are located to be close to each other when the cover member 14 described later is at the uppermost position, as shown in FIG. 9, so that the mounted semiconductor device 22 is held at the alignment plate/positioning member 24 by the latch members 18A and 18B.

Figure 8:
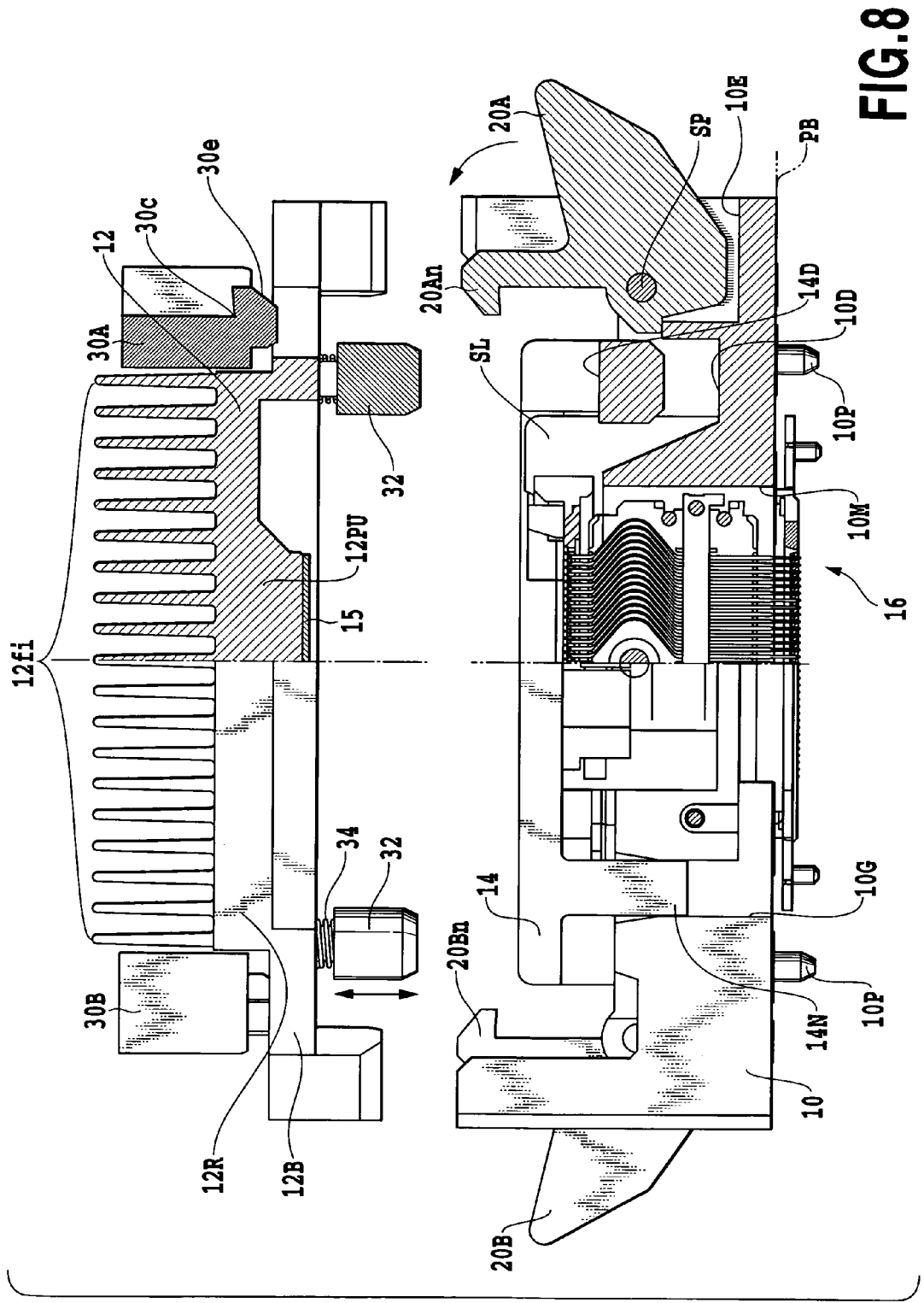
FIG. 8 is an illustration made to available for explaining the attachment of the heat sink member to the socket body in the embodiment shown in FIG. 2.

On the periphery of the module accommodation portion 10M, poles 10TC and 10TD are provided opposite to each other while intersecting a straight line connecting the guide members 10TA and 10TB. Each of the poles 10TC and 10TD of the same structure as that of the guide members 10TA and 10TB has a notch portion SL in a central area thereof. As shown in FIG. 8, in a lower part of the respective notch portion, a recess 10D is formed via a partitioning wall, in which a convex portion of the cover member 14 is inserted. On an outer side of the recess 10D, there is a recess 10E larger than the recess 10D. In the recess 10E, a lever member 20A or 20B is provided for selectively holding the heat sink 12 described later relative to the socket body 10.

As illustrated in FIGS. 4 and 8, the lever member 20A has a hole into which is inserted a shaft pin SP with a predetermined gap. Opposite ends of the shaft pin SP are supported by the peripheral edge of the recess 10E. Thereby, the lever member 20A is supported to be rotatable within the recess 10E on the shaft pin SP. Also, directly beneath the lever member 20A, there is a coil spring (not shown) for biasing the same in the direction shown by an arrow in FIG. 8. Accordingly, an end of the lever member 20A on a side closer to the recess 10D is brought into contact with the upper end of the above-mentioned partitioning wall. Further, a hook 20An selectively engaged with an end of the heat sink member 12 is formed at a proximal end of the lever 20A to be integral therewith, as shown in FIG. 8. The hook 20An extends from the proximal end generally parallel to the partitioning wall described above as shown In FIGS. 3 and 8. A grip is formed in the hook An at a position deviated from a widthwise center axis to one side.

In this regard, the lever member 20B has the same structure as that of the lever member 20A except for a position of a grip 20Bn. The grip 20Bh is formed to be integral with the lever member at a position deviated from a widthwise center axis to the other side. Accordingly, the grip 20Bh is obliquely opposed to the grip 20Ah.

When the grips 20Ah and 20Bh are rotated clockwise and counterclockwise, respectively, in FIG. 8, the hooks 20An and 20Bn are apart from each other to release the heat sink member 12.

The module accommodation portion 10M has a cross-section in correspondence to that of the contact pin module 16 described later. When the contact pin module 16 is accommodated in the module accommodation portion 10M and located to a predetermined position, the contact pin module 16 and the terminal section thereof are positioned relative to the alignment plate/positioning member 24.

The contact pin module 16 mainly includes side plates defining opposite ends thereof extending perpendicular to a paper surface of FIG. 3, and a plurality of lead frames laid generally parallel to each other between both the side plates via spacers. A pair of groups of the contact pins in the respective lead frames form a group of connecting terminals for the semiconductor device and a group of connecting terminals for the printed wiring board.

As shown in FIG. 4 in an enlarged manner, the alignment plate/positioning member 24 includes positioning sections 24A for supporting four corners of the semiconductor device 22 as an object to be tested and a planar section 24B for coupling the positioning sections 24A to each other.

The planar section 24B on which the semiconductor device 22 is placed has a plurality of relatively small recesses $24a_i$ (i=1 to n; n is a positive integer) in correspondence to the respective terminals of the semiconductor device 22, arranged in the vertical and horizontal directions with a predetermined space between centers of the adjacent ones. Also, the recess $24a_i$ communicates with a through hole $24b_i$ (i=1 to n; n is a positive integer) into which is inserted the respective terminal section of the contact pin module 16 in a movable manner. Accordingly, the position of the respective terminal of the mounted semiconductor device 22 relative to the planar section 24B is positioned by the recess $24a_i$, and the position of the respective terminal of the semiconductor device 22 relative to the group of the terminals in the contact pin module 16 is positioned.

The alignment plate/positioning member 24 is supported by each coil springs (not shown) provided between a bottome of bores in the socket body 10 to be movable within a predetermined range in the pressing direction of the latch members 18A and 18B.

On a pair of opposite sides in the periphery of the socket body 10, grooves 10G movably engageable with four hooks 14N formed to be integral with the cover member 14 and extending toward the socket body 10 as shown in FIGS. 3 and 8. The respective groove 10G is formed in the moving direction of the cover member 14. Also, a tip end of the hook 14N is engaged with an end of the groove 10G when the cover member 14 is at the uppermost position as shown in FIG. 8.

Further, at three corners in the four corners of the socket body 10, poles 10PA, 10PB and 10PC are provided for positioning the cover member 14.

As shown in FIGS. 3 and 4, the frame-shaped cover member 14 has an opening 14a in a central area thereof, through which passes the periphery of the upper end of the semiconductor device 22 or the guide members 10TA to 10TD.

In portions of the cover member 14 corresponding to the recesses 10R of the socket body 10, the arm members 14A coupled to the latch members 18A and 18B, respectively, are projected toward the socket body 10 as shown in FIG. 9.

The arm member 14A has a gap for catching a proximal end of the latch member 18A in a rotatable manner. The arm member 14A has a hole into which is inserted the pin CP for coupling the arm member 14A to the latch member 18A.

As shown in FIGS. 3 and 8, the plurality of hooks 14N to be engaged with the grooves 10G of the socket body 10 are projected toward the socket body 10 in portions of the cover member 14 corresponding to the grooves 10G of the socket body 10.

Also, in portions of the cover member 14 opposed to spring receiving sections in the socket body 10, four spring receiving sections (not shown) corresponding thereto are provided, respectively. In the latter spring receiving sections, the other ends of the coil springs 28 for biasing the cover member 14 in a direction away from the socket body 10 are disposed.

Figure 1:
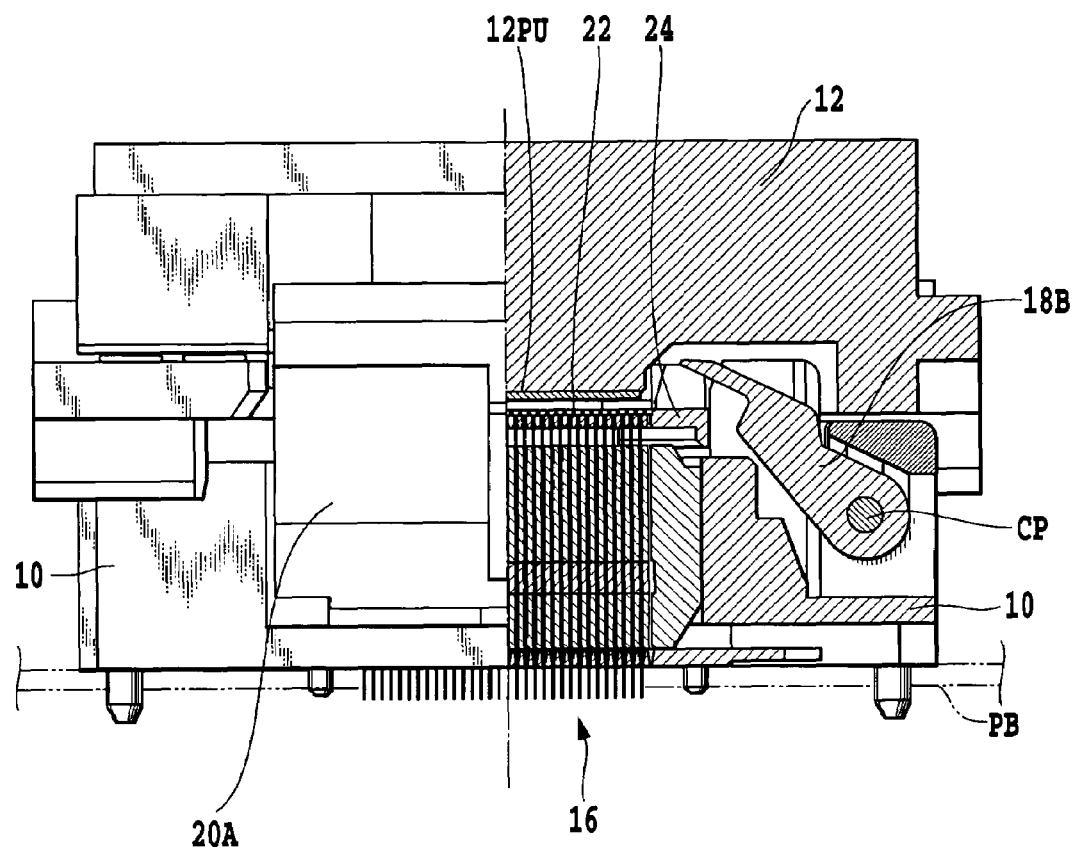
FIG. 1 is a sectional view showing a important part of one embodiment of the semiconductor device socket according to the present invention.

As shown in FIG. 1, the latch member 18B includes a proximal end section having a hole for inserting the above-mentioned pin CP in a rotatable manner, a pressing surface section to be selectively brought into contact with the upper surface of the semiconductor device 22, and a coupling section for coupling the proximal end section to the pressing surface section.

In the coupling section of the latch member 18B, there is a guide pin movably engaged with both the grooves in the respective guide members 10TA and 10TB.

In this regard, since the latch member 18A disposed point-symmetrical to the latch member 18B has the same structure as that of the latch member 18B, the description thereof will be eliminated.

Portions in the cover member 14 corresponding to the respective notch portions SL in the socket body 10 have recesses 14D to be engageable with the pressing members 32 of the heat sink 12 described later as shown in FIG. 4. The recess 14D has an inner diameter larger than a front end diameter of the pressing member 32 in the heat sink member 12.

Figure 6A:
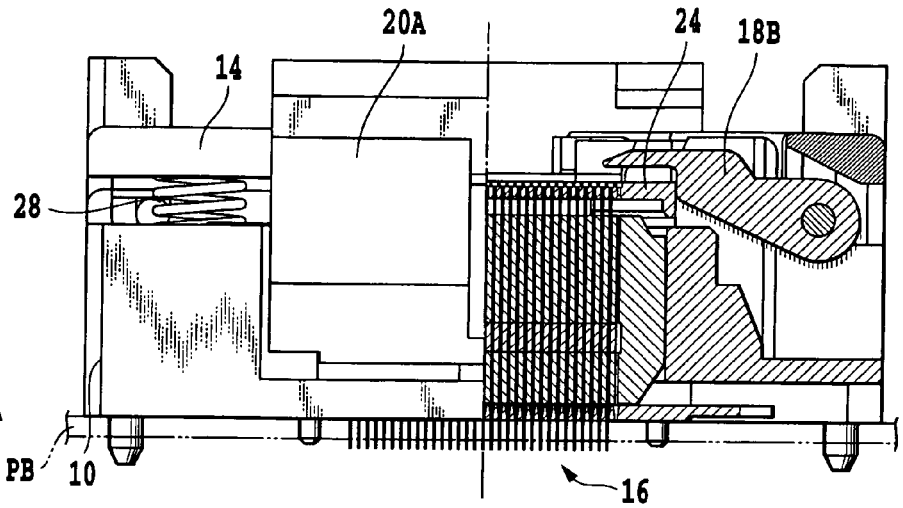
FIGS. 6A, 6B and 6C are illustrations made to available for explaining the mounting of the semiconductor device to the socket body, respectively.
Figure 6B:
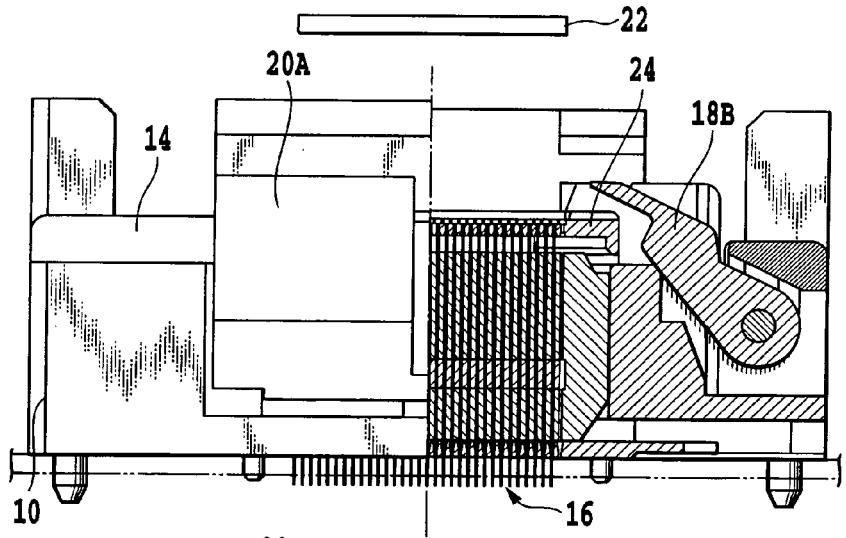

Accordingly, when the cover member 14 is pressed toward the socket body 10 against the biasing force of the coil springs 28 as shown in FIG. 6A, the proximal end sections of the latch members 18A and 18B descends in synchronism therewith and the guide pins are guided by the above-mentioned grooves, whereby the pressing surface sections of the latch members 18A and 18B are away from each other as shown in FIG. 6B. That is, the upper side of the module accommodation portion 10M in the socket body 10; i.e., the upper side of the alignment plate/positioning member 24; is open.

Figure 6C:
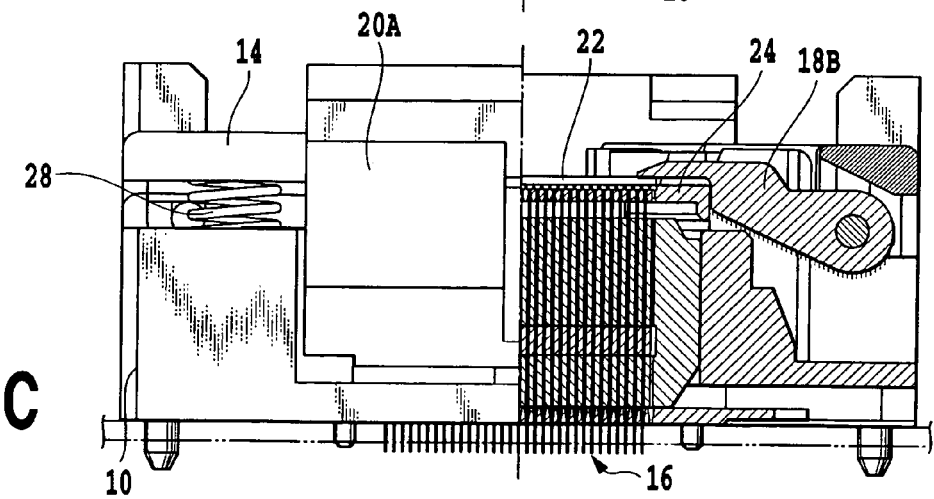

On the other hand, when the cover member 14 rises due to the biasing force of the coil spring 28 as shown in FIG. 8, the proximal end sections of the latch members 18A and 18B rise in synchronism therewith as well as the guide pins are guided by the grooves, whereby the pressing surface sections of the latch members 18A and 18B approach each other. That is, as shown in FIG. 6C, pressing surface sections are made to enter the alignment plate/positioning member 24 of the socket body 10.

As shown in FIGS. 2 and 3, the heat sink member 12 includes a heat radiating section 12R in which a plurality of fins 12fi (i=1 to n; n is a positive integer) are arranged at a predetermined gap, a base section 12B integral with the heat radiating section 12R, disposed on the cover member 14 of the socket body 10, and mounts 30A and 30B as engaged members selectively engageable with the hooks 20An and 20Bn of the lever members 20A and 20B in the socket body described above.

The heat radiating section 12R is made of metallic material having good heat conductivity, such as aluminum alloy. The plurality of fins 12fi are arranged generally parallel to each other at a gap in the rotating direction of the lever members 20A and 20B. A total surface area of the plurality of fins 12fi is determined so that the temperature of the semiconductor device is within an allowable range in accordance with an amount of heat generated from the semiconductor device during the test.

Projections 12PA, 12PB and 12PC engageable with the poles 10PA, 10PB and 10PC in the socket body 10 when the heat sink member 12 is mounted extend outward from the base section 12B. When the heat sink member 12 is mounted to the socket body 10, the position of the heat sink member 12 relative to the socket body 10 is determined by these projections 12PA, 12PB and 12PC.

Generally at a central area of the surface in the base section 12 opposed to the above-mentioned contact pin module 16, as shown in FIGS. 8 and 9, a pressing section 12PU is formed in such a manner as to contact with the upper surface of the semiconductor device 22 to press the same. The pressing section 12PU operated as a touching portion is protruded from the other surface section.

Figure 14:
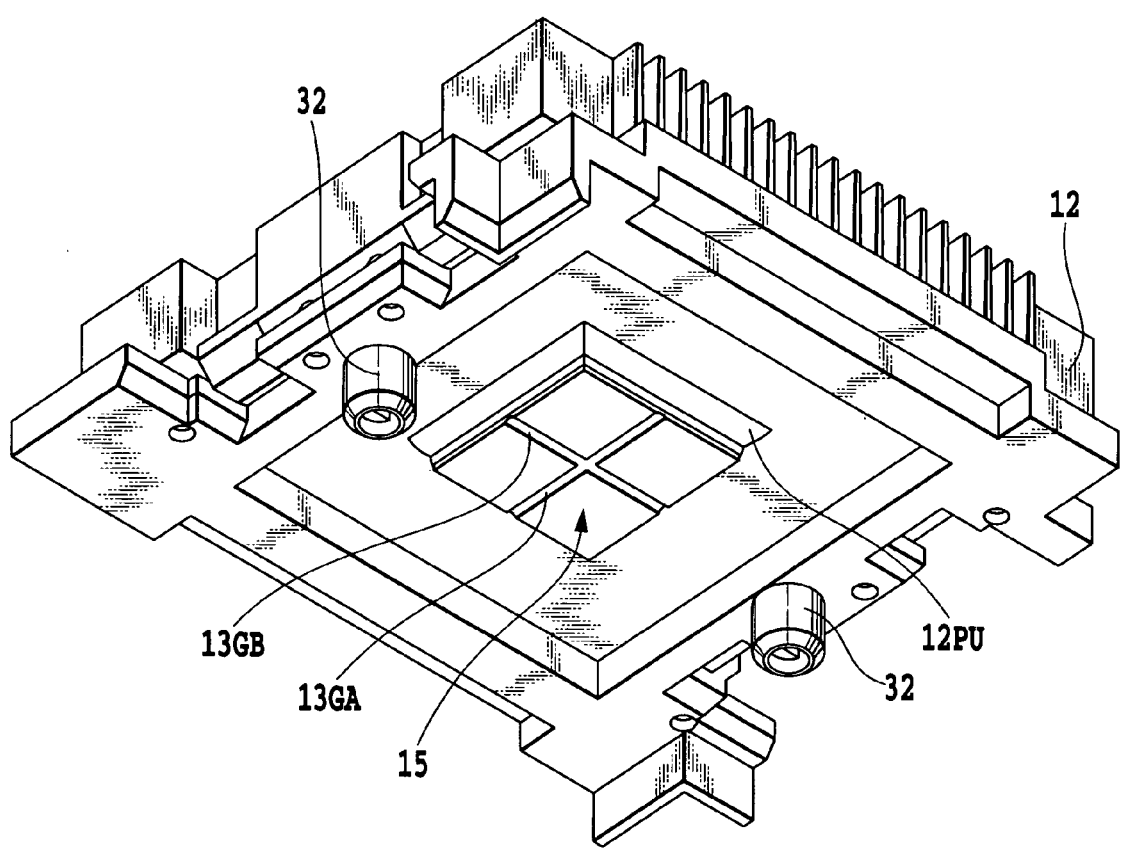
FIG. 14 is a perspective view of the heat sink member in the embodiment shown in FIG. 2 as seen from a pressing side.
Figure 16:
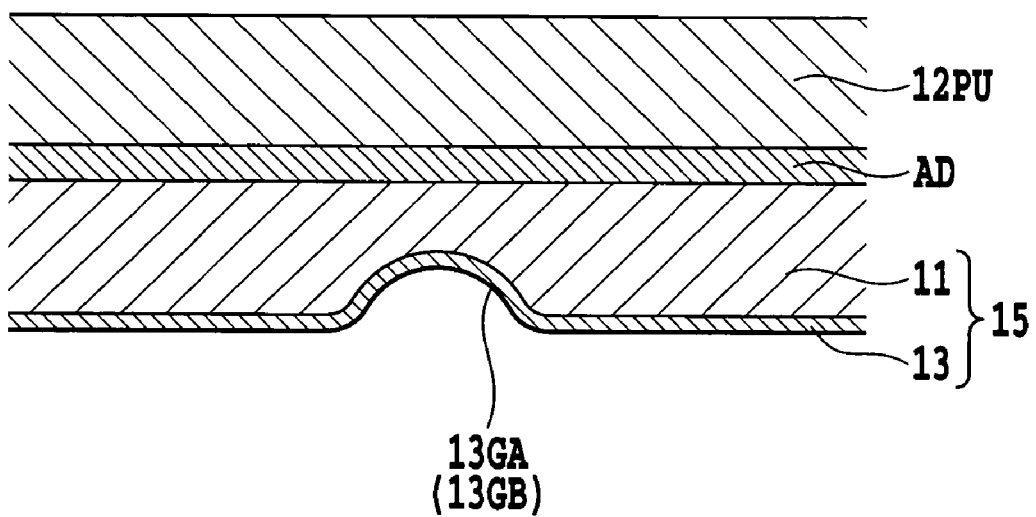
FIG. 16 is an enlarged partially sectional view illustrating the heat transmitting sheet and pressing portion of the heat sink member.

As shown in FIG. 14, on the surface layer of the pressing section 12PU, a heat transmission sheet 15 is adhered by means of an adhesive AD for enhancing the heat dissipation effect. The heat transmission sheet 15 includes a graphite sheet 11 fixed on the surface of the pressing section 12PU via the adhesive AD and a resinous film 13 covering the surface of the graphite sheet 11 as enlargedly shown in FIG. 16. The graphite sheet 15 of substantially non-elasticity is obtainable, for example, by refining plumbago ore. Also, on the surface of the resinous film 13, grooves 13GA and 13GB crossed generally in the vertical direction to each other to from a cross-shape are formed as air-communication paths. A bottom of the grooves 13GA and 13GB is generally arcuate. When the grooves 13GA and 13GB are formed, a metallic jig having a convex portion corresponding to the grooves 13GA and 13GB is in press-contact with the film 13 or the graphite sheet 15 to facilitate the formation thereof.

Figure 15:
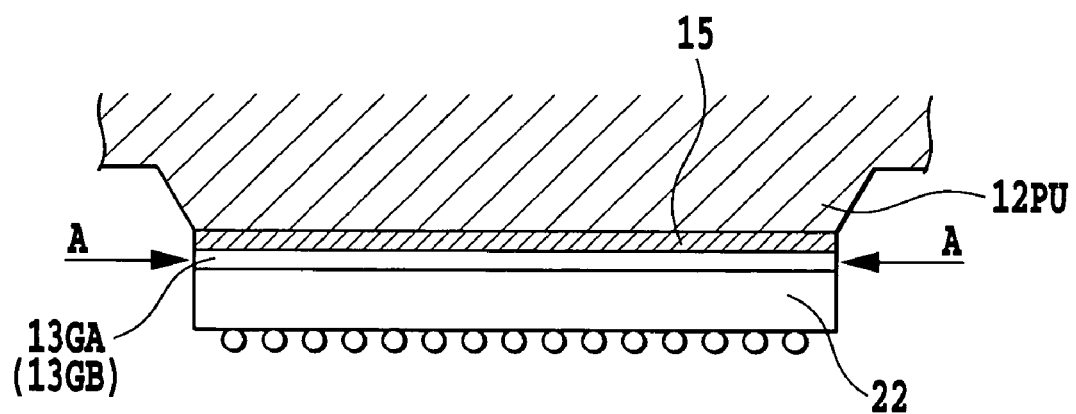
FIG. 15 is a partially sectional view illustrating condition of the contact of the upper surface of the semiconductor device with a heat transmitting sheet.

If the grooves 13GA and 13GB are formed in such a manner, it is possible to prevent the upper surface of the semiconductor device 22 from adhering to the heat transmission sheet 15 since air is able to enter the grooves 13GA and 13GB in the direction indicated by an arrow A in FIG. 15 after the test has been performed while bringing the pressing section 12PU of the heat sink member 12 into contact with the upper surface of the semiconductor device 22 as described later.

Figure 17:
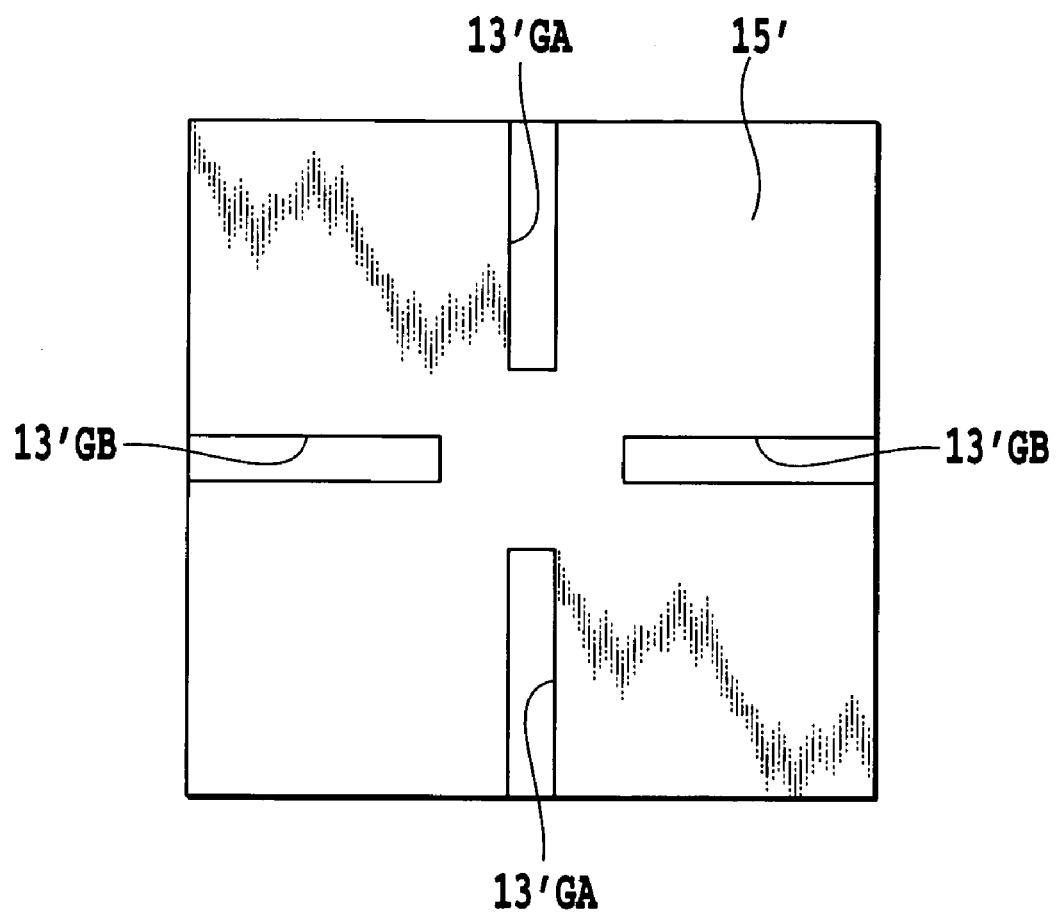
FIG. 17 is a plan view showing another example of grooves in the heat transmitting sheet.
Figure 18:
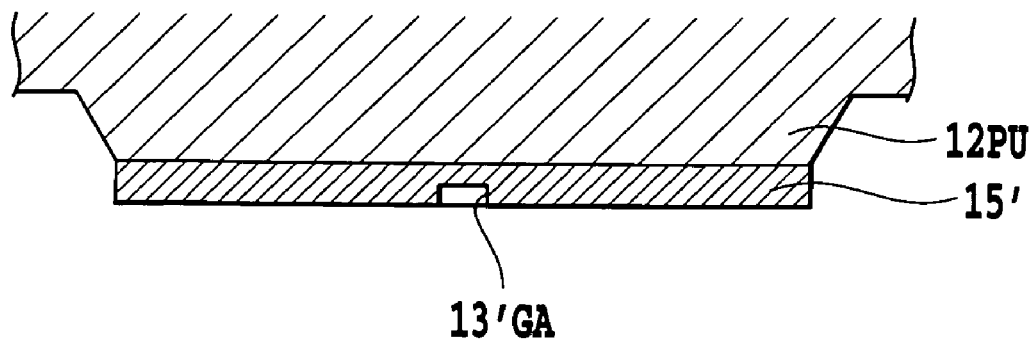
FIG. 18 is a sectional view illustrating the heat transmitting sheet and the pressing portion.

With grooves of the heat transmission sheet 15, while the grooves 13GA and 13GB of the heat transmission sheet 15 intersect and are connected with each other generally at a center thereof, this is not limitative but, as shown in FIGS. 17 and 18, grooves 13'GA and 13'GB formed in a heat transmission sheet 15' may not be crossed to each other generally at a center thereof. That is, the grooves 13'GA and 13'GB may be partitioned generally at a center thereof respectively.

In this regard, the number of the grooves should not be limited to two but may be more than two. Also, the intersecting angle of the grooves should not be limited to 90° but may be obliquely intersected at a predetermined angle.

Figure 19:
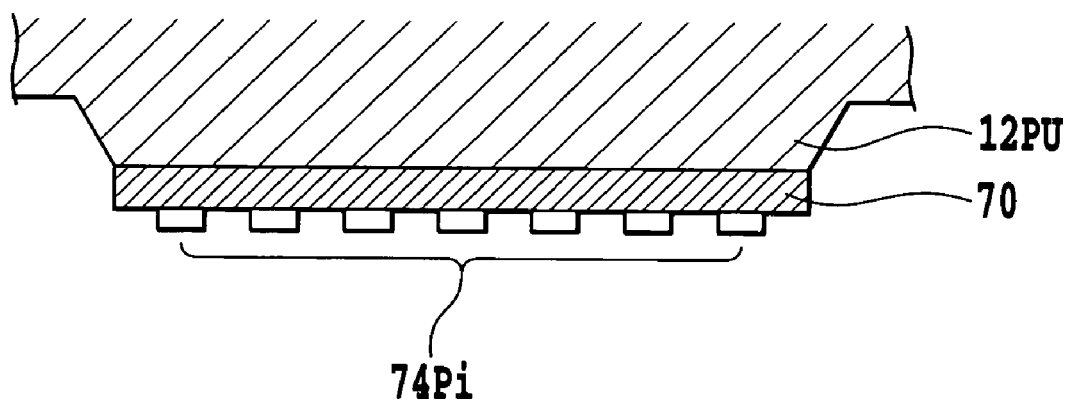
FIG. 19 is a partially sectional view illustrating a heat transmitting sheet together with a pressing portion of a heat sink member in a further embodiment.
Figure 20:
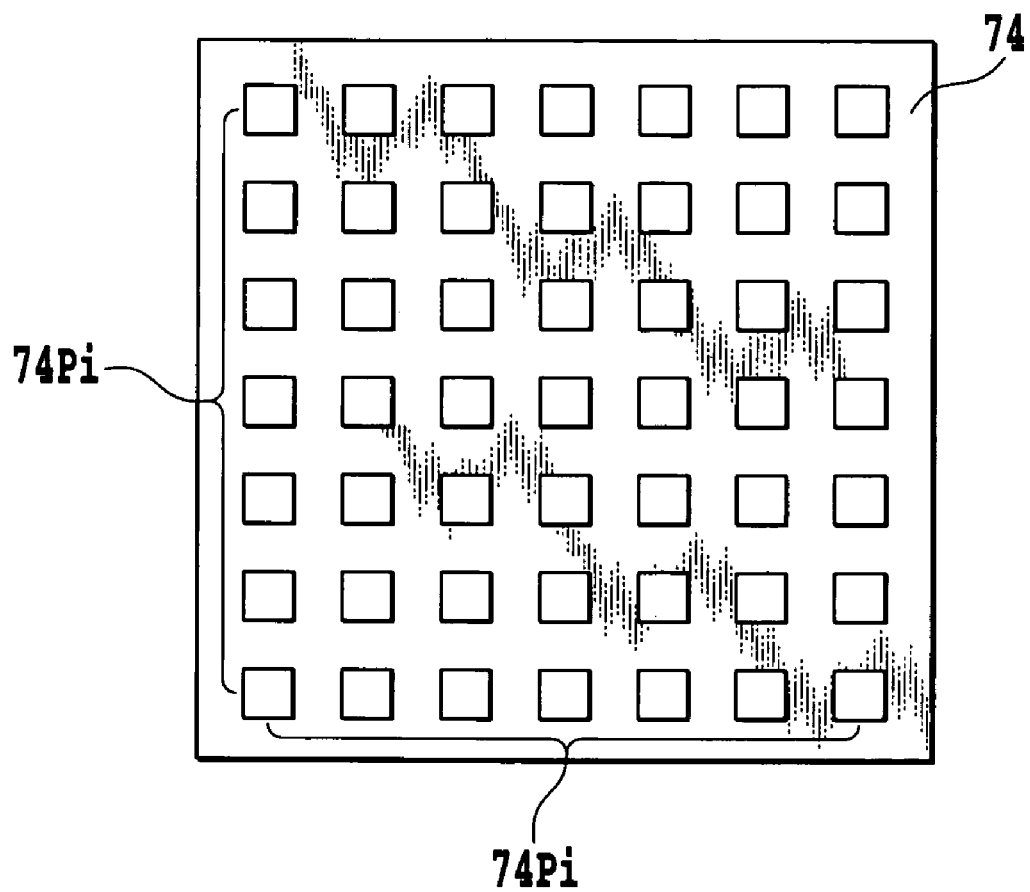
FIG. 20 is a plan view of the embodiment shown in FIG. 19.

Further, a shape of means provided on the surface of the heat transmission sheet 15 for the purpose of introducing air to avoid the sticking of the semiconductor device 22 may be grooves but may be a plurality of protrusions 74Pi (i=1 to n; n is a positive integer) evenly spaced in a matrix manner to define a plurality of grooves in the vertical and horizontal directions, for example, as shown in FIGS. 19 and 20.

Figure 21:
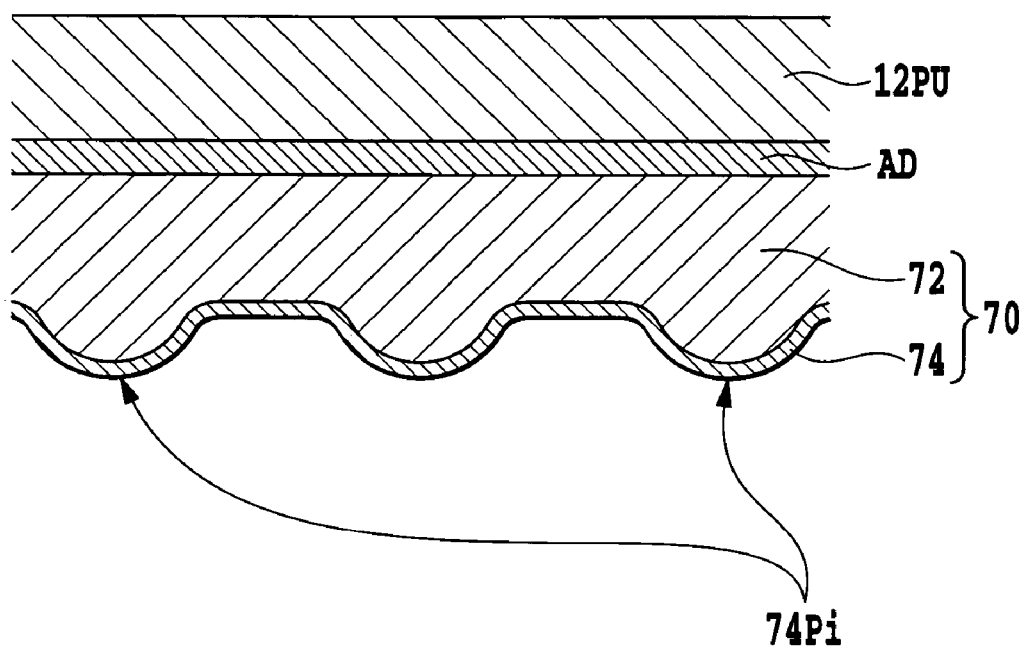
FIG. 21 is an enlarged partially sectional view illustrating the heat transmitting sheet and the pressing portion shown in FIG. 19.

The heat transmission sheet 70 includes a graphite sheet 72 adhered to the surface of the pressing section 12PU with an adhesive AD and a resinous film 74 covering the surface of the graphite sheet 72 as shown in an enlarged manner in FIG. 21. The substantially non-elastic graphite sheet 72 is obtained, for example, by refining plumbago ore. Also, a plurality of protrusions 74Pi are formed on the surface of the resinous film 74 in the vertical and horizontal directions. A tip end of the respective protrusion 74Pi has a generally arcuate cross-section. An air communication paths are formed between the respective protrusions 74Pi.

The protrusions 74Pi may be readily formed, for example, by an embossing process. In this regard, a shape of the protrusion 74Pi should not be limited to a rectangle as shown in FIG. 20, of course but may be, for example, a circle or another shape.

As shown in FIGS. 8 and 9, on the periphery of the pressing section 12PU, a pair of pressing members 32 are provided while interposing the pressing section 12PU between the both. The pressing member 32 pressing the bottom of the recess 14D in the cover member 14 is held on a guide pin not shown via a coil spring 34. One end of the guide pin is integral with the base section 12B. A coil spring 34 as biasing means is elastically deformable, and made, for example, of a metallic wire to separate the pressing member 32 away from the base section 12.

Thereby, the pressing member 32 is movable by a predetermined distance in the axial direction of the guide pin indicated by an arrow in FIGS. 8 and 9. That is, when the pressing member 32 is shifted from a state shown in FIG. 8 wherein the heat sink member 12 is not mounted to a state shown in FIG. 3 wherein the heat sink member 12 is mounted, the pressing member 32 pushes the bottom of the recess 14D in the cover member 14 against the bias of the coil spring 34, after which it gradually approaches the base section 12 with a predetermined time lag. Thereby, as described later, the contact timing of the pressing section 12PU in the heat sink 12 with the upper surface of the semiconductor device mounted thereto is determined at an instant after the cover member 14 has reached the lowermost position. Accordingly, it is avoidable that the pressing section 12PU of the heat sink member 12 erroneously enters before the latch members 18A and 18B have been released.

Also, due to the bias of the coil spring 34, an impact is absorbed when the heat sink member 12 is mounted.

In this regard, the pressing member 32 is not limited to that described above, but may be further provided on the upper surface of the cover member 14 in the socket body 10.

On the other hand, when the heat sink member 12 is removed, the pressing member 32 resumes the initial state shown in FIG. 8 due to the bias of the coil spring 34. Since the mounts 30A and 30B have the same structure, the explanation will be done on the mount 30A, while eliminating that on the mount 30B.

As shown in FIGS. 2 and 9, the mount 30A includes a plurality of holes 30a having a composite diametrical cross-section into which is inserted one end of a coil spring 36 for biasing the mount 30A in the direction away from the base section 12B and a plurality of through-holes 30b having a composite diametrical cross-section into which is inserted an attachment screw BS. Center axes of the hole 30a and the through-hole 30b are generally parallel to each other and extend generally in the vertical direction relative to the surface of the base section 12B.

A male thread section of the respective attachment screw BS is screw-engaged with a female thread hole in the base section 12B via the through-hole 30b. Also, the other end of the coil spring 36 is in contact with the surface of the base section 12B. At that time, a predetermined gap CL is formed between the lower end surface of the mount 30A and the surface of the base section 12B. Thereby, the mount 30A is movable by the gap CL against the bias caused by the coil spring 36 as shown in FIG. 9.

At positions in the mount 30A corresponding to the lever member 20A of the socket body 10, there are plurality of steps 30c provided at a predetermined interval, engageable with a front ends of the hooks 20An in the lever member 20A. A chamfer 30e is formed on a lateral surface between the steps 30c in the mount 30A. When the heat sink member 12 is mounted to the socket body 10, the chamfer 30e is in contact with a front end of the hook 20An in the lever member 20A to rotate the hook 20An reverse to the direction indicated by an arrow in FIG. 8.

Accordingly, when the heat sink member 12 is mounted to the above-mentioned socket body 10, when the heat sink member 12 is mounted to the above-mentioned socket body 10, the heat sink member 12 is positioned by the protrusions 12PA, 12PB, 12PC or others, and the chamfers 30e thereof are brought into contact with the front ends of the hooks 20An and 20Bn in the lever members 20A and 20B to rotate the lever members away from each other. Next, the heat sink member 12 is furthermore descends and the mounts 30A and 30B are pressed toward the base section 12B. Thus, the both are made to rotate due to the bias of the above-mentioned coil spring to be closer to each other, whereby the front ends of the hooks 20An and 20Bn in the lever members 20A and 20B are engaged with the respective steps 20c. Accordingly, the heat sink member 12 is held on the socket body 10. At that time, since the mounts 30A and 30B are pushed toward the base sections 12B, the front ends of the hooks 20A and 20B in the lever members 20A and 20B are engaged with the respective steps 30c by a minimum frictional force.

Also, since the thickness variance of the mounted semiconductor device package is absorbed because the mounts 30A and 30B are supported by the coil springs, it is possible for the pressing section 12PU of the heat sink member 12 to be always in tight contact with the outer surface of the semiconductor device package with a constant load.

Figure 5:
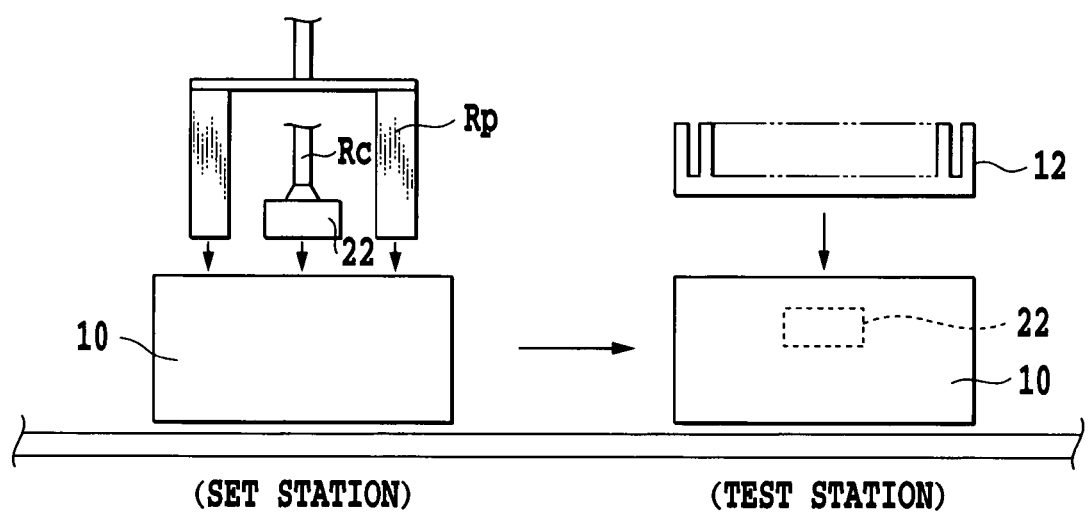
FIG. 5 is an illustration made to available for explaining a test process in embodiment of the semiconductor device socket according to the present invention.

In this configuration, when the semiconductor device 22 is tested by such a system, for example, in the production line, the semiconductor device 22 is mounted onto the alignment plate/positioning member 24 of the socket body 10 in a set station of the production line as shown in FIG. 5. Then, the socket body 10 carrying the semiconductor device 22 is conveyed to a test station disposed apart from the set station. In the test station, the above-mentioned heat sink member 12 is mounted onto the socket body 10, and thereafter the test is carried out in accordance with a predetermined procedure. In this regard, FIG. 5 is schematic wherein only one socket body 10 carrying the heat sink member 12 is disposed on the printed wiring board for simplifying the explanation.

Figure 7:
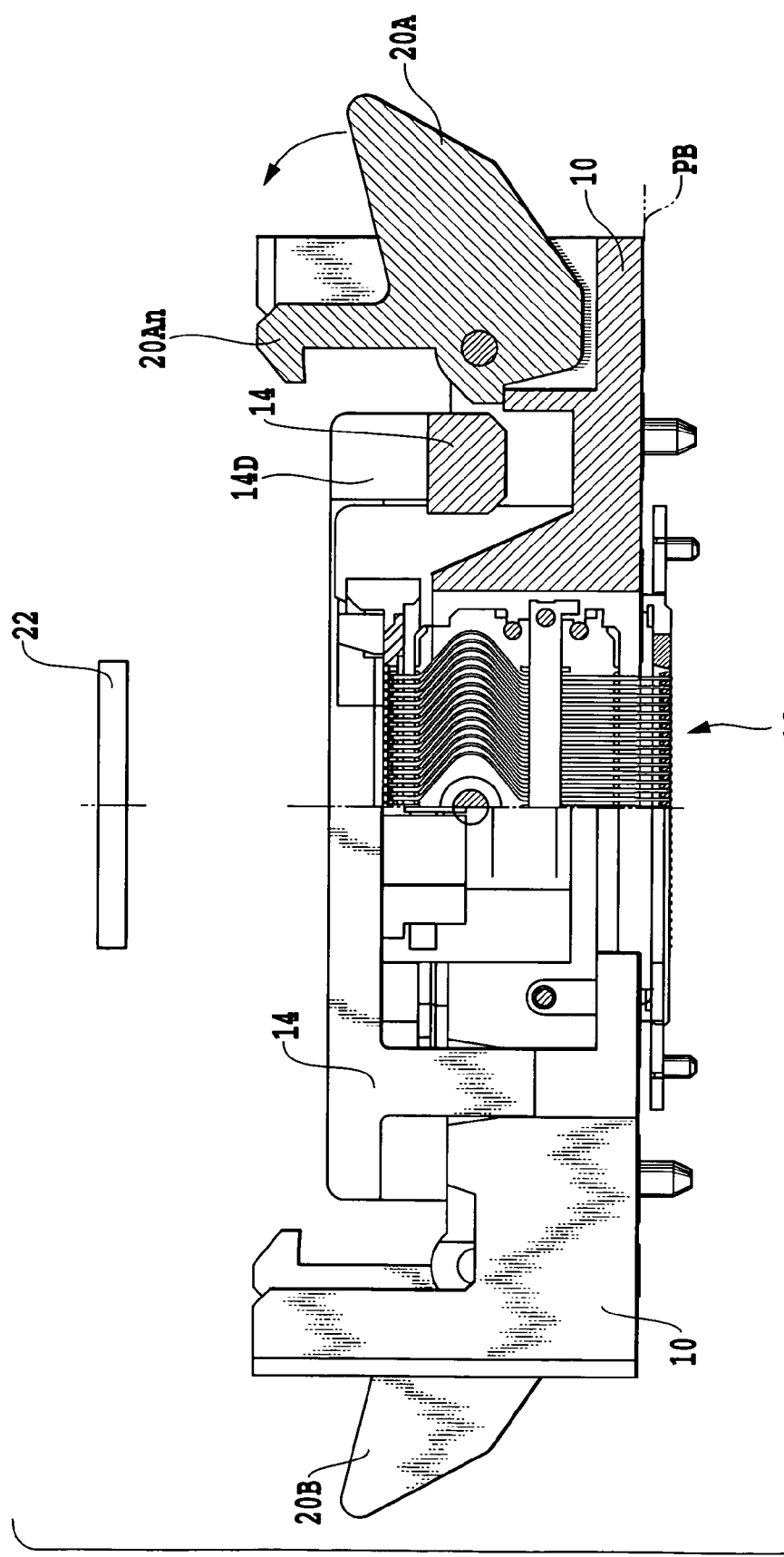
FIG. 7 is a sectional view showing a state of a lever member in correspondence to a state shown in FIG. 6B.

In the set station, as shown in FIGS. 5 and 6B, a front end of an arm Rp of a working robot not shown is brought into contact with the upper surface of the cover member 14 to depress the same against the biasing force of the coil spring 28. Thereby, the cover member 14 is made to move downwardly, and front ends of the latch members 18A and 18B are moved from a holding position shown in FIG. 6A to an open position shown in FIG. 6B. That is, the front ends of the latch members 18A and 18B are away from the alignment plate/positioning member 24 to form an open space above the alignment plate/positioning member 24. At that time, as shown in FIGS. 6B and 7, the semiconductor device 22 is sucked and held by a hand of a conveyor robot not shown to be conveyed at a position directly above the opening 14a of the cover member 14 and the alignment plate/positioning member 24.

Next, the semiconductor device 22 sucked and held by the hand Rc descends through a space formed between the latch members 18A and 18B, and positioned and mounted on the planar section 24B as indicated by a chain double-dashed line in FIG. 4. At that time, the respective terminals in the semiconductor device 22 are in contact with the corresponding recesses of the planar section 24B.

Subsequently, the cover member 14 rises while the front end of the robot arm Rp is brought into contact with the upper surface of the cover member 14, from the open position to the holding position, as shown in FIG. 6C due to the biasing force of the coil spring 28.

At that time, since the pressing surface section at the front ends of the latch members 18A and 18B are made to rotate generally at the same timing, the semiconductor device 22 is pressed to the group of terminals in the contact pin module 16. Accordingly, the semiconductor device 22 is pressed by the pressing surface sections in the latch members 18A and 18B, and as a result, is uniformly pressed at a predetermined pressure toward the planar section 24B and held there.

The socket body 10 is conveyed to the test station by a predetermined conveyor means. At that time, since the semiconductor device 22 is uniformly pressed toward the planar section 24B at the predetermined pressure and held there, the semiconductor device 22 is prevented from coming off and jumping out of the socket body 10 during the conveyance.

Upon mounting the heat sink member 12 onto the socket body in the test station, the heat sink member 12 is located at a position directly above the socket body 12 as shown in FIGS. 8 and 9, and then made to descends by means of the robot hand not shown.

Figure 10:
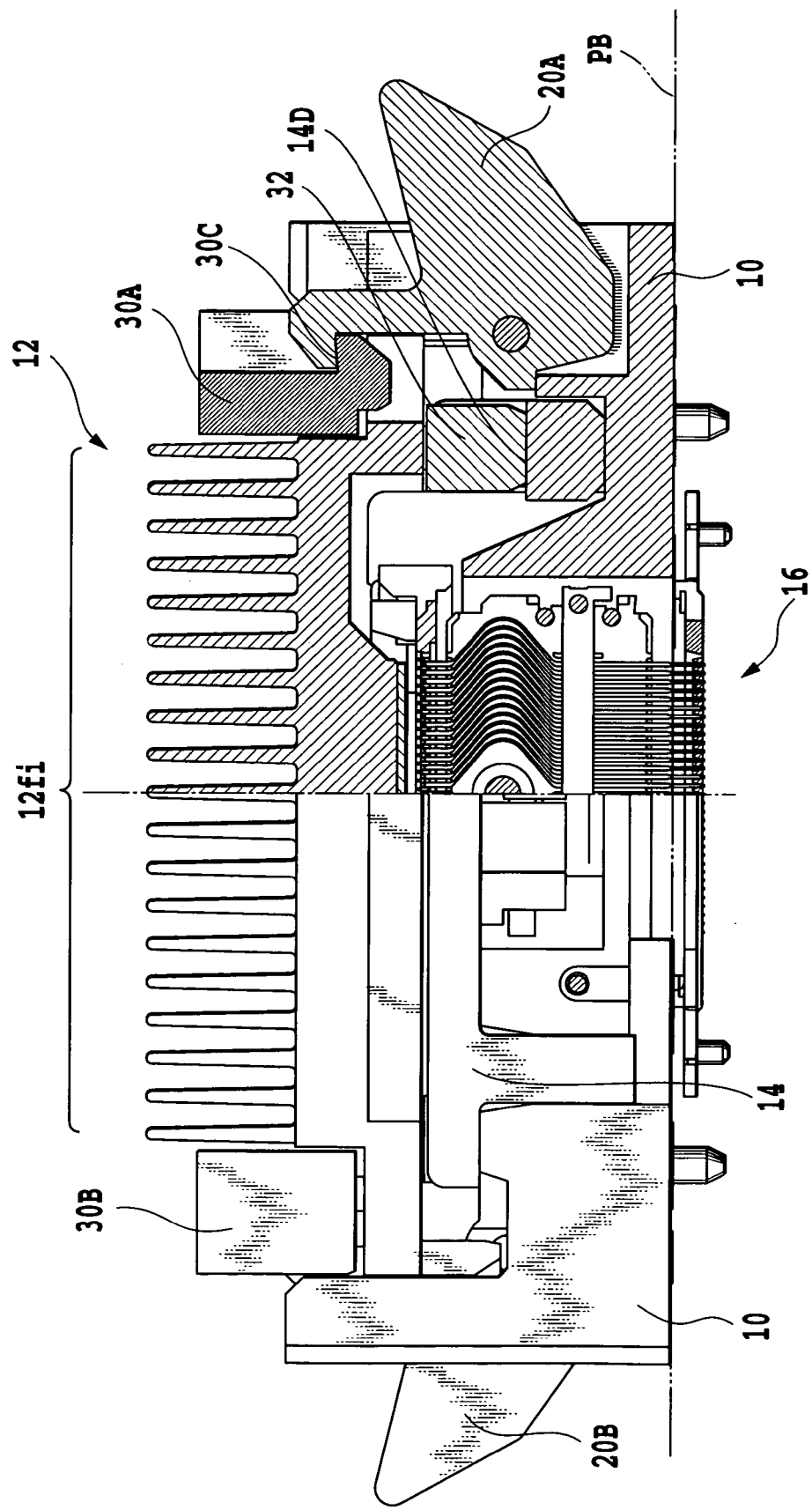
FIG. 10 is an illustration made to available for explaining the attachment of the heat sink member to the socket body in the embodiment shown in FIG. 2.

First, the pressing member 32 of the heat sink member 12 is brought into contact with the bottom of the recess 14D in the cover member 14 to initiate the descent of the cover member 14 as shown in FIG. 10. At that time, the pressing surface section 12PU in the heat sink member 12 is not yet brought into contact with the upper surface of the semiconductor device 22.

Figure 11:
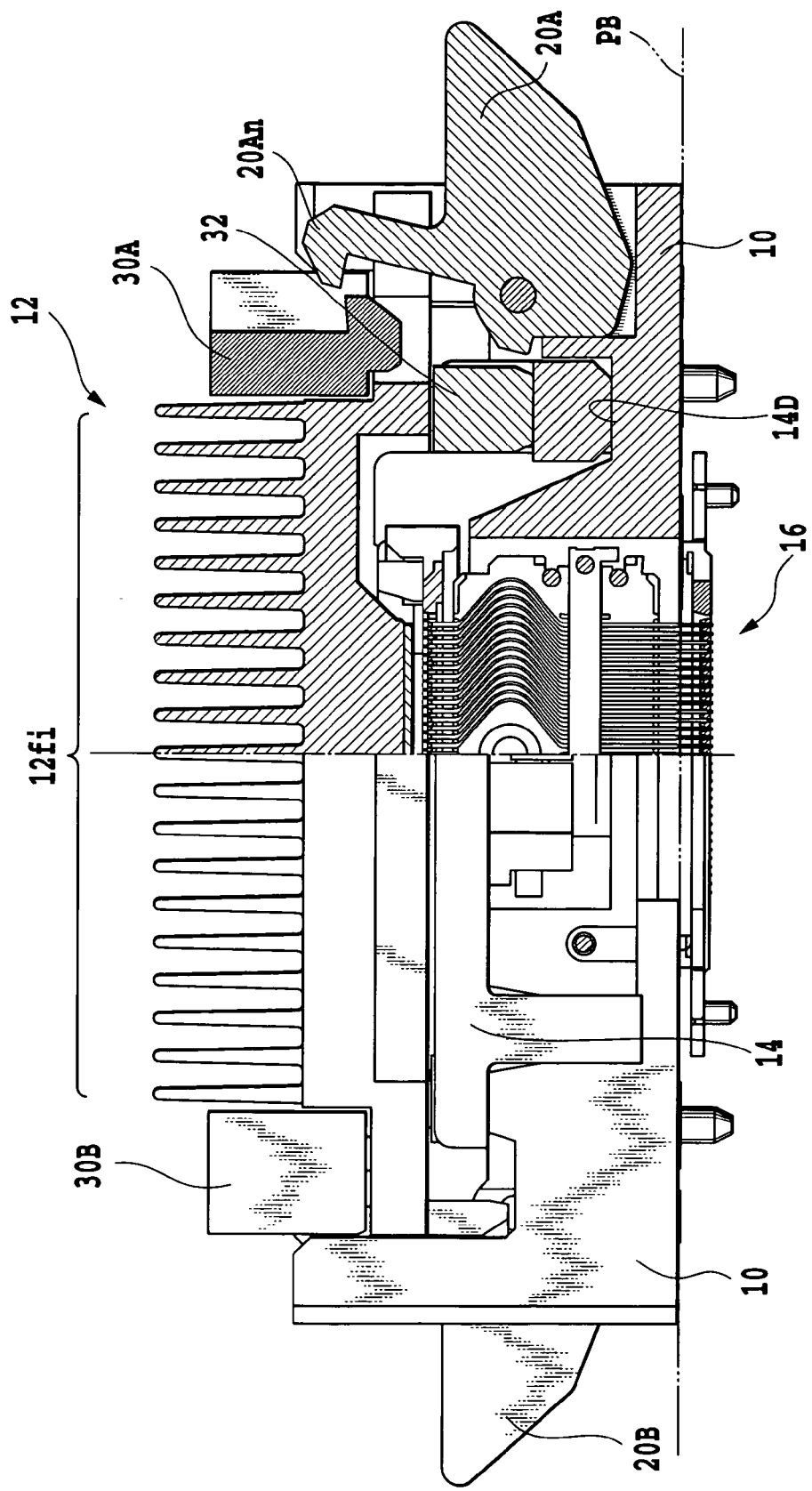
FIG. 11 is an illustration made to available for explaining the attachment of the heat sink member to the socket body in the embodiment shown in FIG. 2.

Subsequently, when the heat sink member 12 furthermore descends, the cover member 14 reaches the lowermost position as shown in FIG. 11, and thereafter, the pressing surface section 12PU of the heat sink member 12 is brought into contact with the upper surface of the semiconductor device 22 as shown in FIG. 1 with a predetermined delay. At that time, since the mounts 30A and 30B are pressed by the robot hand against the biasing force of the coil springs 36, the front ends of the hooks 20An and 20Bn in the lever members 20A and 20B are once apart from each other as described before, and are close to each other thereafter to be engaged with the steps 30c. Thereby the heat sink member 12 is fixed to the socket body 10.

Accordingly, since the pressing surface section 12PU of the heat sink member 12 enters while the latch members 18A and 18B are maximally apart from each other, there is no risk in that the latch members 18A and 18B interfere with the heat sink member 12.

When a test signal is fed to the input/output section of the printed wiring board with the cover member 14 being maintained at the test position, the test signal is supplied to the semiconductor device 22 through the contact pin module 16. If the abnormality of the circuit in the semiconductor device is detected, the abnormality detection signal is issued from the semiconductor device 22 and fed to an external device for determining the malfunction through the input/output section.

When the test of the semiconductor device 22 has completed, the semiconductor device 22 is removed from the tester. First, the grips 20Ah and 20Bh in the lever members 20A and 20B are pushed downward to disengage the hooks 20An and 20Bn from the steps 30c, whereby the heat sink member 12 is released from the socket body 10. Thereafter, the semiconductor device 22 is taken out.

FIGS. 12A and 12B illustrate the comparison of a mounting area B per one conventional semiconductor socket (see the above-mentioned Japanese Patent Application Laid-open No. 2003-123926) wherein the heat sink member 52 fixed to the heat sink support 54 having the fastening device (attachment lever) 50 is detachably supported on the socket body with a mounting area A per one inventive heat sink member 12 according to the above embodiment.

As apparent from FIGS. 12A and 12B, the mounting area A per one heat sink member 12 according to the embodiment of the present invention having no fastening device is less by approximately 30% than the mounting area B of the conventional device having the heat sink support 54 provided with the fastening device (attachment lever) 50. As a result, according to the embodiment of the present invention, it is possible to increase the number of devices mounted on one printed wiring board in comparison with the conventional device.

Further, FIGS. 13A and 13B illustrate the comparison of a generally square contact area CB in the conventional heat sink member 52 with a generally square contact area CA in the inventive heat sink member 12, wherein in the conventional semiconductor device socket, the heat sink member 52 fixed to the heat sink support 54 provided with the fastening device (attachment lever) 50 shown in FIG. 12A is detachably supported on the socket body 56 (see the above-mentioned Japanese Patent Application Laid-open No. 2003-123926).

In this regard, in the conventional device shown in FIG. 13A, when the mounted heat sink member 52 is brought into contact with the semiconductor device package, the front ends of the latch members 58 holding the semiconductor device on the alignment plate/positioning member 60 always advances in the planar section 60B of the alignment plate/positioning member 60.

Accordingly, as apparent from FIGS. 13A and 13B, since the pressing surface section 12PU is brought into contact with the outer surface of the semiconductor device package while the latch members 18A and 18B are away from each other as shown in FIG. 1, the generally square contact area CA of the heat sink member 12 with the semiconductor device package increases by approximately 30% in comparison with the generally square contact area CB of the conventional heat sink member 52 with the semiconductor device package. Thereby, in the embodiment of the present invention, it is possible to facilitate the cooling efficiency relative to the conventional device.

Also, according to the embodiment of the present invention, since the fastening device (attachment lever) is unnecessary, a size (a heat radiation area) of the fin 12fi is maximized while the number of parts is reduced, and moreover, there is no risk of the disturbance of cooling air flow.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes.

What is claimed is:

1. A semiconductor device socket comprising:
a socket body provided with a semiconductor device accommodation portion for accommodating a semiconductor device and a group of contact terminals for electrically connecting the semiconductor device accommodated in said semiconductor device accommodation portion with external electronic circuits;
a holding device provided around said semiconductor device accommodation portion to be capable of selectively occupying either a position for holding the semiconductor device in said semiconductor device accommodation portion or a position for releasing the semiconductor device therefrom;
a holding device driving section for driving said holding device; and
a heat sink member detachably disposed in said socket body, having a contacting section brought into contact with a periphery of the semiconductor device disposed in said semiconductor device accommodation portion to cool the semiconductor device;
wherein when said heat sink member is attached to said socket body, the contacting section of said heat sink member is brought into contact with the periphery of the semiconductor device while the holding device occupies the released position by said holding device driving section.

2. A semiconductor device socket as claimed in claim 1, wherein a heat transmission sheet is provided at the contacting section of the heat sink member, having a plurality of air communicating paths for introducing air between the periphery of the semiconductor device.

3. A semiconductor device socket as claimed in claim 2, wherein said heat transmission sheet contains graphite obtained by refining plumbago ore.

4. A semiconductor device socket as claimed in claim 1, wherein said holding device comprises latch members provided to be movable rotationally on the periphery of the semiconductor device accommodation portion, and said holding device driving section comprises a cover member coupled to the latch members and supported at said socket body to be movable upward and downward.

5. A semiconductor device socket as claimed in claim 4, wherein said heat sink member has pressing members for pressing said cover member via biasing means.

6. A semiconductor device socket comprising:
a socket body provided with a semiconductor device accommodation portion for accommodating a semiconductor device and a group of contact terminals for electrically connecting the semiconductor device accommodated in said semiconductor device accommodation portion with external electronic circuits;
a heat sink member latchably detachable from said socket body, having a contacting section brought into contact with a periphery of the semiconductor device disposed in said semiconductor device accommodation portion to cool the semiconductor device,
a fastening device provided in said socket body, for selectively fixing or releasing said heat sink member on said socket body;
a holding device provided around the semiconductor device accommodation portion to be capable of selectively occupying either a position for holding the semiconductor device in said semiconductor device accommodation portion or a position for releasing the semiconductor device therefrom; and
a holding device driving section for driving the holding device, wherein
when said heat sink member is attached to said socket body, the contacting section of said heat sink member is brought into contact with the periphery of the semiconductor device while the holding device occupies the released position by said holding device driving section.

7. A semiconductor device socket as claimed in claim 6, wherein the holding device comprises latch members provided to be movable rotationally on the periphery of the semiconductor device accommodation portion, and said holding device driving section comprises a cover member coupled to said latch members and supported at said socket body to be movable upward and downward.

8. A semiconductor device socket as claimed in claim 7, wherein said heat sink member has pressing members for pressing said cover member via biasing means.

9. A semiconductor device socket as claimed in claim 6, wherein said heat sink member is provided with a mount selectively engaged with a lever member of said fastening device, and
said mount is supported by a spring member disposed between the same and a base section of said heat sink member to be movable by a predetermined distance in the thickness direction of the semiconductor device mounted to said socket body.

10. A semiconductor device socket comprising:
a socket body provided with a semiconductor device accommodation portion for accommodating a semiconductor device and a group of contact terminals for electrically connecting the semiconductor device accommodated in said semiconductor device accommodation portion with external electronic circuits;
a heat sink member detachably disposed in said socket body, having a contacting section brought into contact with a periphery of the semiconductor device disposed in said semiconductor device accommodation portion to cool the semiconductor device; and
a fastening device provided in said socket body, for selectively fixing or releasing said heat sink member on said socket body;
wherein said heat sink member is provided with a mount selectively engaged with a lever member of said fastening device, and
said mount is supported by a spring member disposed between the same and a base section of said heat sink member to be movable by a predetermined distance in the thickness direction of the semiconductor device mounted to said socket body.

11. A semiconductor device socket as claimed in claim 10, further comprising a holding device, wherein the holding device comprises latch members provided to be movable rotationally on the periphery of the semiconductor device accommodation portion, and a holding device driving section comprising a cover member coupled to said latch members and supported at said socket body to be movable upward and downward.

12. A semiconductor device socket as claimed in claim 11, wherein said heat sink member has pressing members for pressing said cover member via biasing means.

13. A semiconductor device socket as claimed in claim 10, wherein said heat sink member is provided with a mount selectively engaged with a lever member of said fastening device, and a chamfer formed in said mount is in contact with a front end of a hook in the lever member and said fastening device.

* * * * *